(12) United States Patent
Qian et al.

(10) Patent No.: US 10,403,619 B2
(45) Date of Patent: Sep. 3, 2019

(54) SEMICONDUCTOR DEVICE HAVING SHARED POWER LINE CONNECTIONS AND METHOD OF MANUFACTURING THE SAME

(71) Applicant: Samsung Electronics Co., Ltd., Suwon-si (KR)

(72) Inventors: Yubo Qian, Yongin-si (KR); Byung-Sung Kim, Suwon-si (KR); Chul-Hong Park, Seongnam-si (KR); Haewang Lee, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/787,244

(22) Filed: Oct. 18, 2017

(65) Prior Publication Data
US 2018/0358345 A1    Dec. 13, 2018

(30) Foreign Application Priority Data

Jun. 8, 2017    (KR) .................. 10-2017-0071832

(51) Int. Cl.
*H01L 27/02*     (2006.01)
*H01L 23/528*    (2006.01)
(Continued)

(52) U.S. Cl.
CPC ...... *H01L 27/0207* (2013.01); *G06F 17/5072* (2013.01); *G06F 17/5077* (2013.01);
(Continued)

(58) Field of Classification Search
CPC ......... H01L 27/0207; H01L 21/823871; H01L 23/5226; H01L 23/5283; H01L 23/5286;
(Continued)

(56) References Cited

U.S. PATENT DOCUMENTS 7,139,184 B2    11/2006    Schloesser
8,324,673 B2    12/2012    Chung et al.
(Continued)

FOREIGN PATENT DOCUMENTS

JP    2012-074731 A    4/2012
KR    10-0919369 B1    9/2009
(Continued)

*Primary Examiner* — Shahed Ahmed
(74) *Attorney, Agent, or Firm* — Muir Patent Law, PLLC

(57) ABSTRACT

Disclosed are a semiconductor device and a method of manufacturing the same. The semiconductor device includes first and second logic cells adjacent to each other in a first direction on a substrate, a gate electrode extending in the first direction in each of the first and second logic cells, a power line extending in a second direction at a boundary between the first and second logic cells, and a connection structure electrically connecting the power line to an active pattern of the first logic cell and to an active pattern of the second logic cell. The connection structure lies below the power line and extends from the first logic cell to the second logic cell. A top surface of the connection structure is at a higher level than that of a top surface of the gate electrode.

20 Claims, 38 Drawing Sheets

(51) Int. Cl.
*H01L 23/522* (2006.01)
*G06F 17/50* (2006.01)
*H01L 21/8238* (2006.01)
*H01L 27/092* (2006.01)
*H03K 19/0948* (2006.01)
*H01L 23/535* (2006.01)
*H01L 29/78* (2006.01)
*H01L 29/66* (2006.01)

(52) U.S. Cl.
CPC .. *H01L 21/823871* (2013.01); *H01L 23/5226* (2013.01); *H01L 23/5283* (2013.01); *H01L 23/5286* (2013.01); *H01L 23/535* (2013.01); *H01L 27/0924* (2013.01); *H03K 19/0948* (2013.01); *H01L 21/823821* (2013.01); *H01L 29/66545* (2013.01); *H01L 29/7848* (2013.01)

(58) Field of Classification Search
CPC ............... H01L 23/535; H01L 27/0924; H01L 21/823821; H01L 29/7848; H01L 21/28026; H01L 21/823475; H01L 23/52; H01L 23/5221; H01L 23/528; H03K 19/0948
See application file for complete search history.

(56) References Cited

U.S. PATENT DOCUMENTS

| | | |
|---|---|---|
| 9,418,896 B2 | 8/2016 | Kang et al. |
| 9,436,792 B2 | 9/2016 | Baek et al. |
| 9,583,493 B2 | 2/2017 | Kim et al. |
| 9,704,862 B2 | 7/2017 | Park et al. |
| 2009/0167394 A1 | 7/2009 | Bosshart |
| 2011/0049575 A1 | 3/2011 | Tanaka |
| 2012/0062301 A1* | 3/2012 | Noguchi ................. H03K 5/133 327/288 |
| 2012/0280287 A1 | 11/2012 | Hou et al. |
| 2016/0125117 A1 | 5/2016 | Kim et al. |
| 2016/0343708 A1 | 11/2016 | Park et al. |
| 2017/0117223 A1* | 4/2017 | Azmat .............. H01L 21/28518 |
| 2017/0133365 A1 | 5/2017 | Lim et al. |
| 2018/0350928 A1* | 12/2018 | Huang ............ H01L 21/823431 |

FOREIGN PATENT DOCUMENTS

| | | |
|---|---|---|
| KR | 10-1569466 B1 | 11/2015 |
| KR | 10-2016-0034167 A | 3/2016 |
| KR | 10-2016-0040085 A | 4/2016 |
| KR | 10-2016-0051532 A | 5/2016 |
| KR | 10-2016-0056762 A | 5/2016 |

* cited by examiner

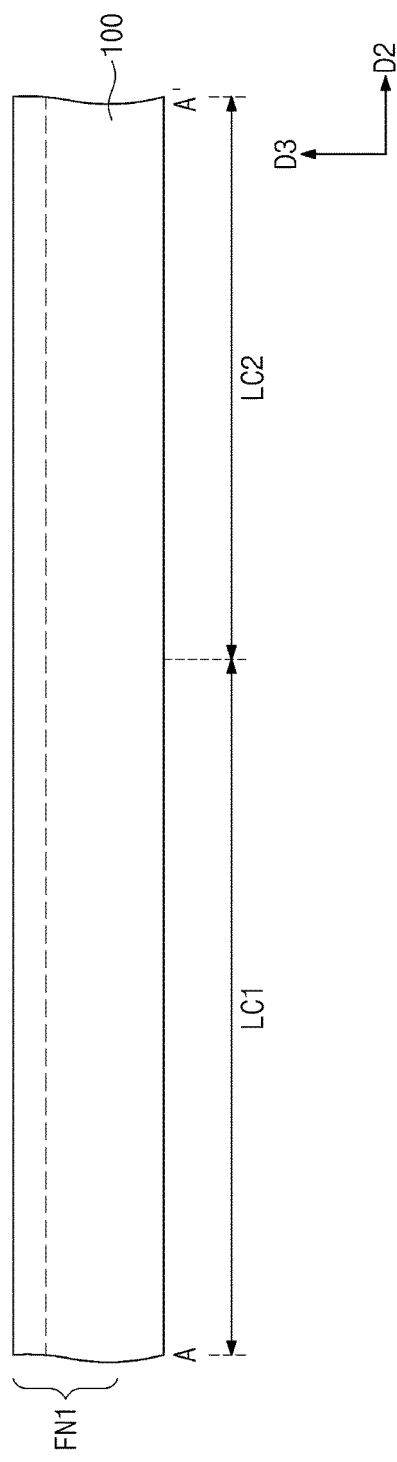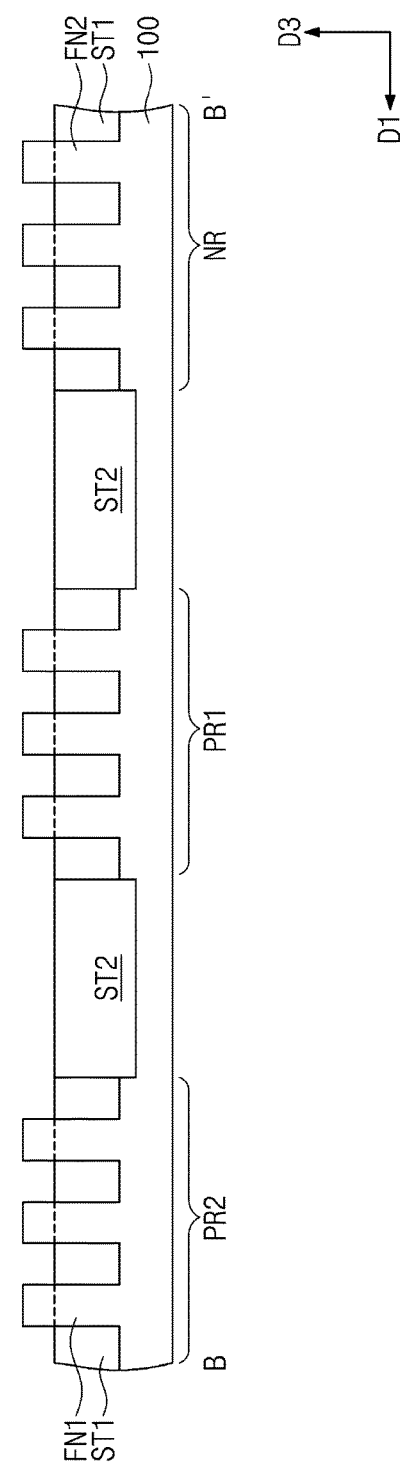

SEMICONDUCTOR DEVICE HAVING SHARED POWER LINE CONNECTIONS AND METHOD OF MANUFACTURING THE SAME

CROSS-REFERENCE TO RELATED APPLICATIONS

This U.S. nonprovisional patent application claims priority under 35 U.S.C § 119 to Korean Patent Application No. 10-2017-0071832 filed on Jun. 8, 2017, the entire contents of which are hereby incorporated by reference.

BACKGROUND

The present inventive concept relates to a semiconductor device and a method of manufacturing the same, and more particularly, to a semiconductor device including a field effect transistor and a method of manufacturing the same.

A semiconductor device is considered to be an important factor in electronic industry because of its small size, multi-function, and/or low fabrication cost. A semiconductor device may be categorized as any one of a semiconductor memory device that stores logic data, a semiconductor logic device that processes operations of logic data, and a hybrid semiconductor device that has both memory and logic elements. A semiconductor device has been increasingly required for high integration with the advanced development of the electronic industry. For example, a semiconductor device has been increasingly requested for high reliability, high speed, and/or multifunction. A semiconductor device is gradually complicated and highly integrated to meet these requested characteristics.

SUMMARY

Some embodiments of the present inventive concept provide a semiconductor device including a highly-integrated field effect transistor.

Embodiments of the present inventive concept provide a method of manufacturing a semiconductor device including highly-integrated field effect transistors.

According to exemplary embodiment of the present inventive concept, a semiconductor device may comprise a gate electrode extending in the first direction in each of the first and second logic cells, a power line extending in a second direction at a boundary between the first and second logic cells, and a connection structure electrically connecting the power line to an active pattern of the first logic cell and to an active pattern of the second logic cell. The connection structure may lie below the power line and extend from the first logic cell to the second logic cell. A top surface of the connection structure may be at a higher level than that of a top surface of the gate electrode. The second direction may cross the first direction.

According to exemplary embodiment of the present inventive concept, a semiconductor device may comprise a first logic cell and a second logic cell adjacent to each other in a first direction on a substrate, a gate electrode extending in the first direction in each of the first and second logic cells, a power line extending in a second direction at a boundary between the first and second logic cells, and a connection structure electrically connecting the power line to an active pattern of the first logic cell and to an active pattern of the second logic cell. The connection structure may comprise a first contact portion on the active pattern of the first logic cell, a second contact portion on the active pattern of the second logic cell, and a bridge portion connecting the first contact portion to the second contact portion. The gate electrode of the second logic cell may be aligned in the first direction with the gate electrode of the first logic cell. The bridge portion may run between the gate electrode of the second logic cell and the gate electrode of the first logic cell, in plan view. The second direction may cross the first direction.

According to exemplary embodiment of the present inventive concept, a method of manufacturing a semiconductor device may comprise designing a layout of the semiconductor device, and using the layout to form patterns on a substrate. The step of designing the layout may comprise placing a first standard cell and a second standard cell adjacent to each other in a first direction, and substituting a connection pattern for a first contact pattern of contact patterns in the first standard cell and a second contact pattern of contact patterns in the second standard cell. The layout may comprise a power pattern extending in a second direction at a boundary between the first and second standard cells. The second direction may cross the first direction. The first contact may extend to the power pattern from an active region of the first standard cell. The second contact pattern may extend to the power pattern from an active region of the second standard cell.

BRIEF DESCRIPTION OF THE DRAWINGS

FIGS. 13A, 15A, 17A, 19A, and 21A illustrate cross-sectional views taken along line A-A' of FIGS. 12, 14, 16, 18, and 20, respectively.

FIGS. 13B, 15B, 17B, 19B, and 21B illustrate cross-sectional views taken along line B-B' of FIGS. 12, 14, 16, 18, and 20, respectively.

DETAILED DESCRIPTION OF EMBODIMENTS

Figure 1:
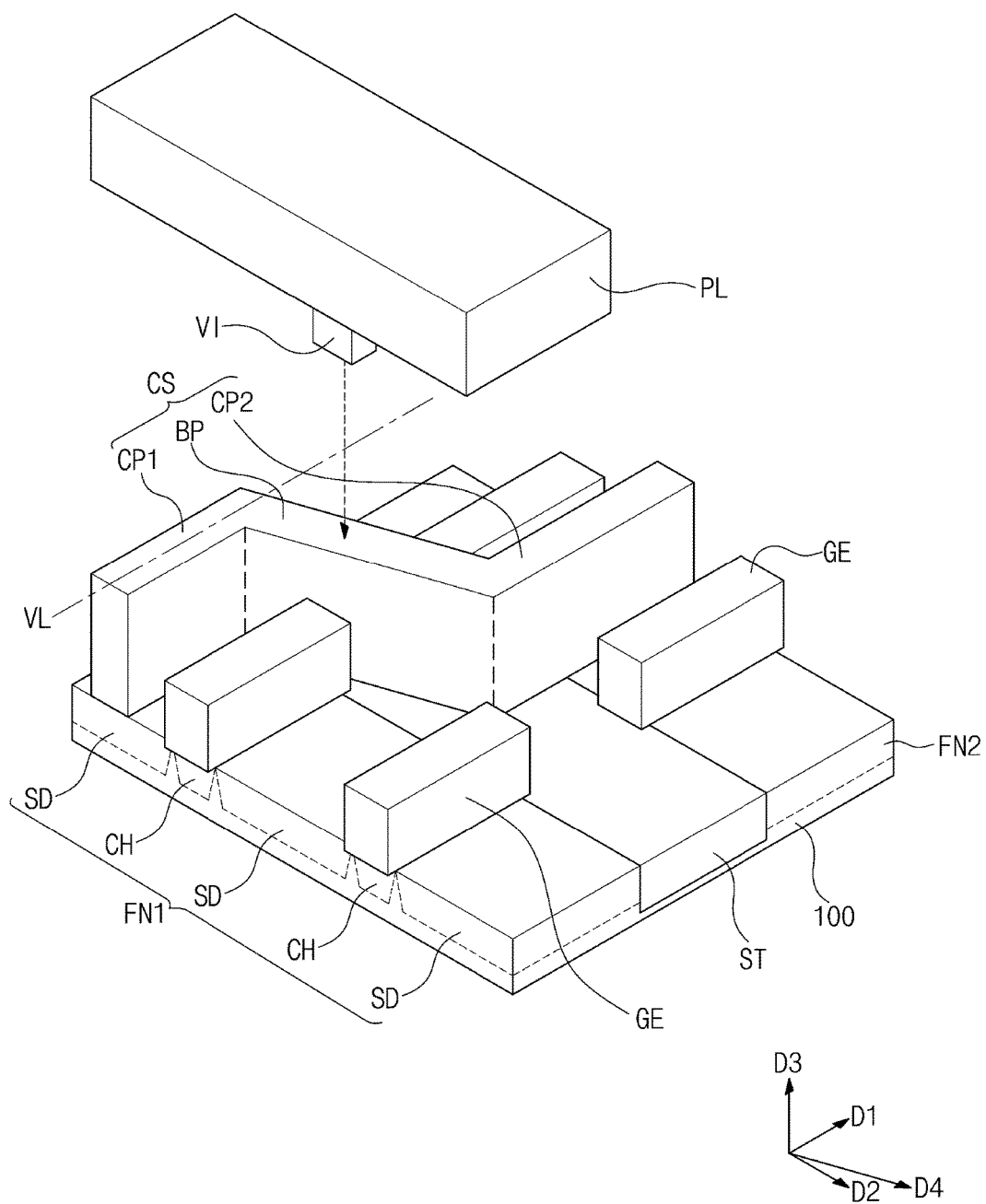
FIG. 1 illustrates a perspective view showing a semiconductor device according to exemplary embodiments of the present inventive concept.

FIG. 1 illustrates a perspective view showing a semiconductor device according to exemplary embodiments of the present inventive concept.

Referring to FIG. 1, a substrate 100 may be provided to include a first active pattern FN1, a second active pattern FN2, and a device isolation layer ST. The device isolation layer ST may be provided in the substrate 100 to define the first and second active patterns FN1 and FN2. The second active pattern FN2 may be spaced apart in a first direction D1 from the first active pattern FN1 across the device isolation layer ST.

Each of the first and second active patterns FN1 and FN2 may include source/drain regions SD and channel regions CH. Each of the channel regions CH may lie between a pair of source/drain regions SD adjacent to each other. The first and second active patterns FN1 and FN2 may include thereon with transistors having the same conductivity. For example, the source/drain regions SD on the first active pattern FN1 may have the same conductivity as that of the source/drain regions SD on the second active pattern FN2.

Gate electrodes GE may be provided on the channel regions CH of the first and second active patterns FN1 and FN2. The gate electrodes GE may extend in the first direction D1. The gate electrodes GE may not extend onto the device isolation layer ST. For example, the gate electrode GE on the second active pattern FN2 may be spaced apart in the first direction D1 from the gate electrode GE on the first active pattern FN1. The gate electrodes GE on the first and second active patterns FN1 and FN2 may be aligned with each other along the first direction D1.

Although not shown, a gate dielectric pattern may be interposed between the channel region CH and the gate electrode GE. The gate electrodes GE may include one or more of conductive metal nitride (e.g., titanium nitride or tantalum nitride) and metal (e.g., titanium, tantalum, tungsten, copper, or aluminum).

A connection structure CS may be provided coupled to the source/drain region SD on the first active pattern FN1 and to the source/drain region SD on the second active pattern FN2. The connection structure CS may cross over the device isolation layer ST and extend from the first active pattern FN1 toward the second active pattern FN2. The connection structure CS may have a top surface higher than those of the gate electrodes GE. The connection structure CS may include at least one metallic material, for example, aluminum, copper, tungsten, molybdenum, and cobalt.

The connection structure CS may include a first contact portion CP1, a bridge portion BP, and a second contact portion CP2. The first contact portion CP1 may be connected to the source/drain region SD on the first active pattern FN1, and the second contact portion CP2 may be connected to the source/drain region SD on the second active pattern FN2.

The second contact portion CP2 may not be aligned with the first contact portion CP1 in the first direction D1. For example, the second contact portion CP2 may be offset from the first contact portion CP1 in a fourth direction D4 crossing the first direction D1. A virtual line VL may be defined to pass through a center of the first contact portion CP1 and to extend in the first direction D1. The second contact portion CP2 may be offset from the virtual line VL in a second direction D2. The bridge portion BP may extend in the fourth direction D4 on the device isolation layer ST. The bridge portion BP may connect the first and second contact portions CP1 and CP2 to each other.

A via VI and a power line PL may be disposed on the connection structure CS. The via VI may be interposed between the bridge portion BP of the connection structure CS and the power line PL. The power line PL may extend in the second direction D2 crossing the first and fourth directions D1 and D4. For example, the second direction D2 may be perpendicular to the first direction D1. For example, the power line PL may have a width greater than those of the via VI and the connection structure CS.

The power line PL may be integrally connected to the via VI. The power line PL and the via VI may include the same metallic material. For example, the metallic material may be one selected from aluminum, copper, tungsten, molybdenum, and cobalt.

Figure 2:
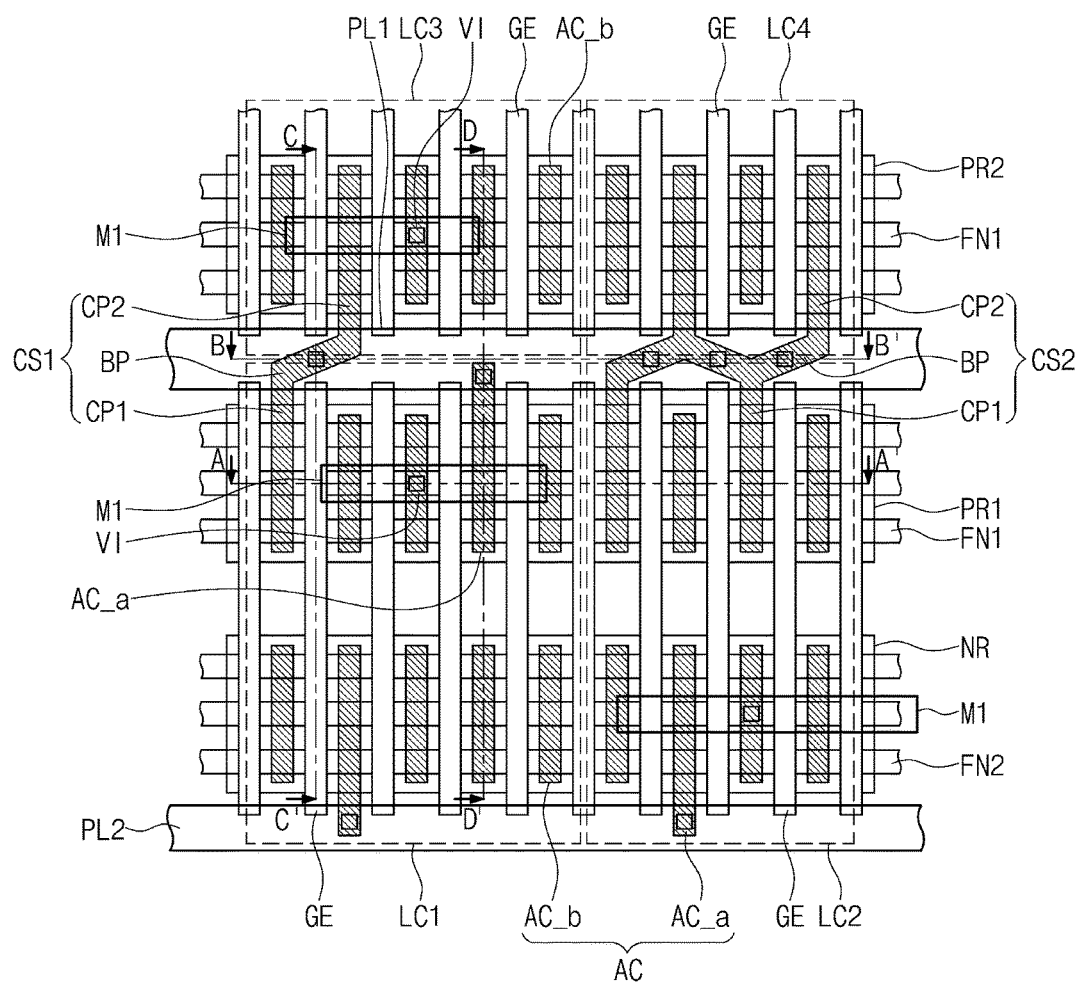
FIG. 2 illustrates a plan view showing a semiconductor device according to exemplary embodiments of the present inventive concept.

FIG. 2 illustrates a plan view showing a semiconductor device according to exemplary embodiments of the present inventive concept. FIGS. 3A to 3D illustrate cross-sectional views respectively taken along lines A-A', B-B', C-C', and D-D' of FIG. 1. In the embodiment that follows, a detailed description of technical features repetitive to those formerly discussed with reference to FIG. 1 will be omitted and differences will be discussed in detail.

Referring to FIGS. 2 and 3A to 3D, first to fourth logic cells LC1 to LC4 may be provided. The first and second logic cells LC1 and LC2 may be arranged in a second direction D2. The third and fourth logic cells LC3 and LC4 may be arranged in the second direction D2. The first and third logic cells LC1 and LC3 may be arranged in a first direction D1. The second and fourth logic cells LC2 and LC4 may be arranged in the first direction D1. Each of the first to fourth logic cells LC1 to LC4 may constitute a logic circuit. For example, each of the first to fourth logic cells LC1 to LC4 may be provided with logic transistors constituting the logic circuit. Logic transistors and electrical lines constituting the first to fourth logic cells LC1 to LC4 are discussed in detail below.

A substrate 100 may be provided. For example, the substrate 100 may be a silicon substrate, a germanium substrate, or a silicon-on-insulator (SOI) substrate. The substrate 100 may be provided with second device isolation layers ST2 defining a first PMOSFET region PR1, a second PMOSFET region PR2, and an NMOSFET region NR. The second device isolation layer ST2 may be formed at or on an upper portion of the substrate 100.

The first PMOSFET region PR1 and the NMOSFET region NR may be spaced apart from each other in the first direction D1 across the second device isolation layer ST2. The first PMOSFET region PR1 and the second PMOSFET region PR2 may be spaced apart from each other in the first direction D1 across the second device isolation layer ST2. The first and second PMOSFET regions PR1 and PR2 and the NMOSFET region NR may extend in the second direction D2. The first PMOSFET region PR1 and the NMOSFET region NR may run across the first and second logic cells LC1 and LC2. The second PMOSFET region PR2 may run across the third and fourth logic cells LC3 and LC4. Although not shown, the second device isolation layers ST2 may define additional PMOSFET regions and additional NMOSFET regions besides the first and second PMOSFET region PR1 and PR2 and the NMOSFET region NR.

The first and second PMOSFET regions PR1 and PR2 may be provided thereon with a plurality of first active patterns FN1 extending in the second direction D2. The NMOSFET region NR may be provided thereon with a plurality of second active patterns FN2 extending in the second direction D2. The first and second active patterns FN1 and FN2 may be portions of the substrate 100 and may protrude from a top surface of the substrate 100. The first and second active patterns FN1 and FN2 may be arranged along the first direction D1.

For example, three first active patterns FN1 may extend side by side along the second direction D2 on each of the first and second PMOSFET regions PR1 and PR2. For example, three second active patterns FN2 may extend side by side along the second direction D2 on the NMOSFET region NR. It should be understood that the first active pattern FN1 is not limited in number and shape on each of the first and second PMOSFET regions PR1 and PR1, and that the second active pattern FN2 is not limited in number and shape on the NMOSFET region NR.

Each of the first and second active patterns FN1 and FN2 may be provided on its opposite sides with first device isolation layers ST1 extending in the second direction D2. The first device isolation layers ST1 may fill trenches between the first active patterns FN1. The first device isolation layers ST1 may fill trenches between the second active patterns FN2.

The first and second active patterns AP1 and AP2 may have upper portions higher than top surfaces of the first device isolation layers ST1. The upper portions of the first and second active patterns FN1 and FN2 may protrude vertically (i.e., in a third direction D3) above the first device isolation layers ST1. The third direction D3 may be perpendicular to the top surface of the substrate 100. Each upper portion of the first and second active patterns FN1 and FN2 may have a fin shape protruding between a pair of the first device isolation layers ST1.

The first and second device isolation layers ST1 and ST2 may be integrally connected to constitute a substantially single insulation layer. The second device isolation layers ST2 may have top surfaces coplanar with those of the first device isolation layers ST1. The second device isolation layers ST2 may have thicknesses greater than those of the first device isolation layers ST1. In this case, the first device isolation layers ST1 may be formed separately from the second device isolation layers ST2. For example, the first and second device isolation layers ST1 and ST2 may include a silicon oxide layer.

First channel regions CH1 and first source/drain regions SD1 may be provided at or on the upper portions of the first active patterns FN1. The first source/drain regions SD1 may be p-type impurity regions. Each of the first channel regions CH1 may be interposed between a pair of the first source/drain regions SD1. Second channel regions CH2 and second source/drain regions SD2 may be provided at or on the upper portions of the second active patterns FN2. The second source/drain regions SD2 may be n-type impurity regions. Each of the second channel regions CH2 may be interposed between a pair of the second source/drain regions SD2.

The first and second source/drain regions SD1 and SD2 may be epitaxial patterns formed by a selective epitaxial growth process. The first and second source/drain regions SD1 and SD2 may have top surfaces higher than those of the first and second channel regions CH1 and CH2. The first and second source/drain regions SD1 and SD2 may include a semiconductor element different from that of the substrate 100. For example, the first source/drain regions SD1 may include a semiconductor element of which lattice constant is greater than that of a semiconductor element of the substrate 100. As a result, the first source/drain regions SD1 may provide the first channel regions CH1 with compressive stress. For example, the second source/drain regions SD2 may include a semiconductor element of which lattice constant is smaller than that of a semiconductor element of the substrate 100. As a result, the second source/drain regions SD2 may provide the second channel regions CH2 with tensile stress. Alternatively, the second source/drain regions SD2 may include the same semiconductor element as that of the substrate 100.

Figure 3A:
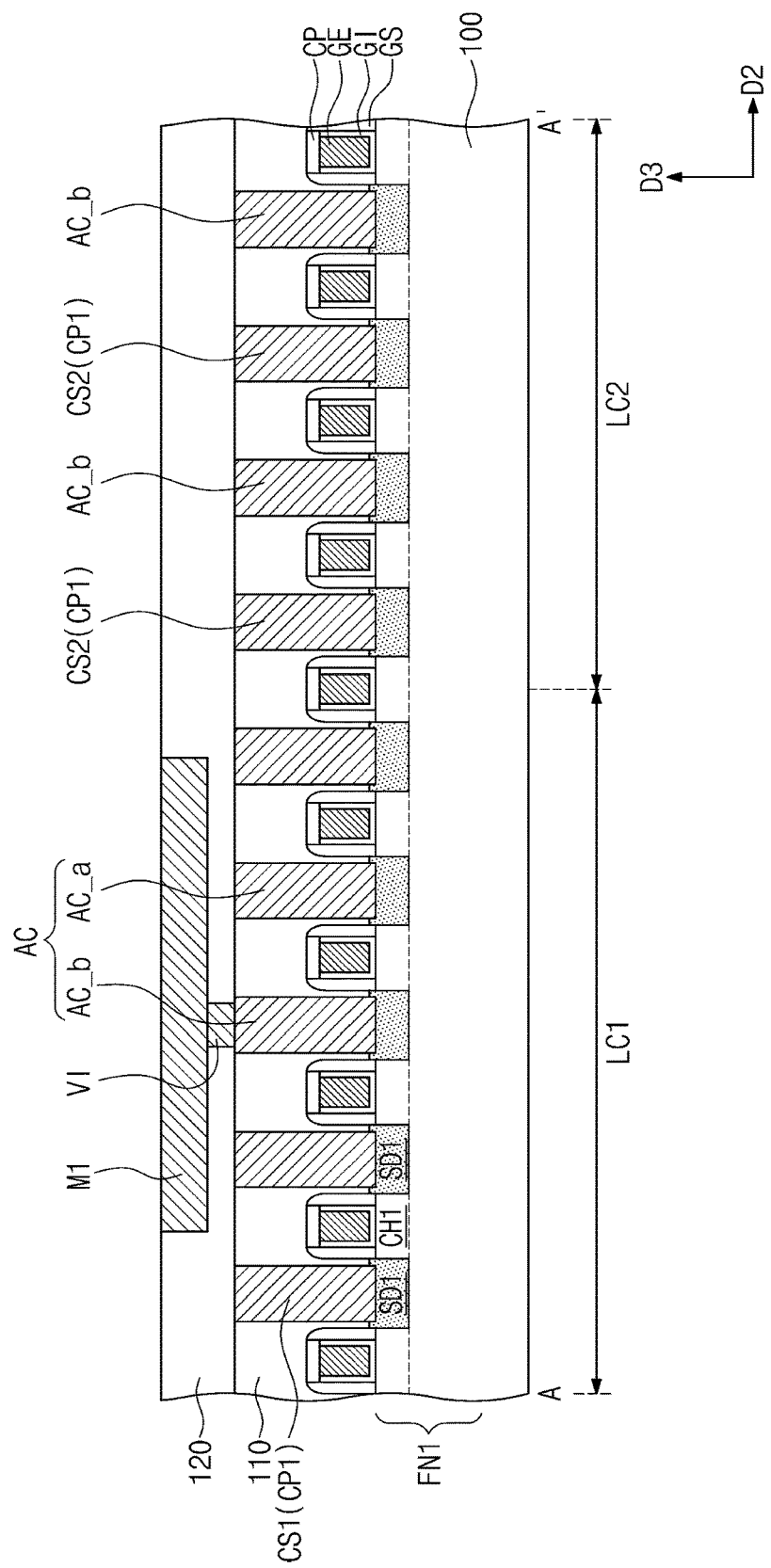
FIGS. 3A, 3B, 3C, and 3D illustrate cross-sectional views respectively taken along lines A-A', B-B', C-C', and D-D' of FIG. 1.
Figure 3B:
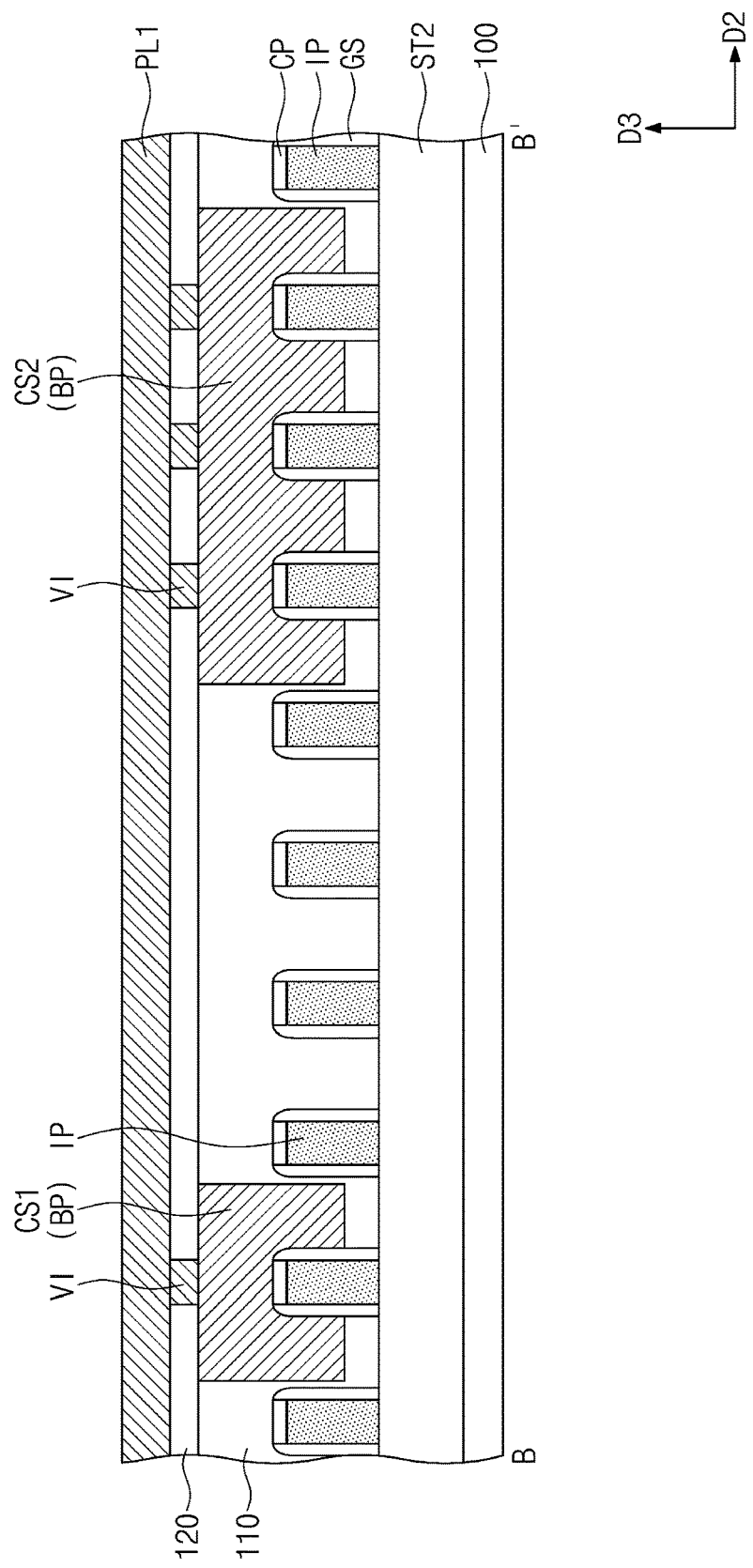
Figure 3C:
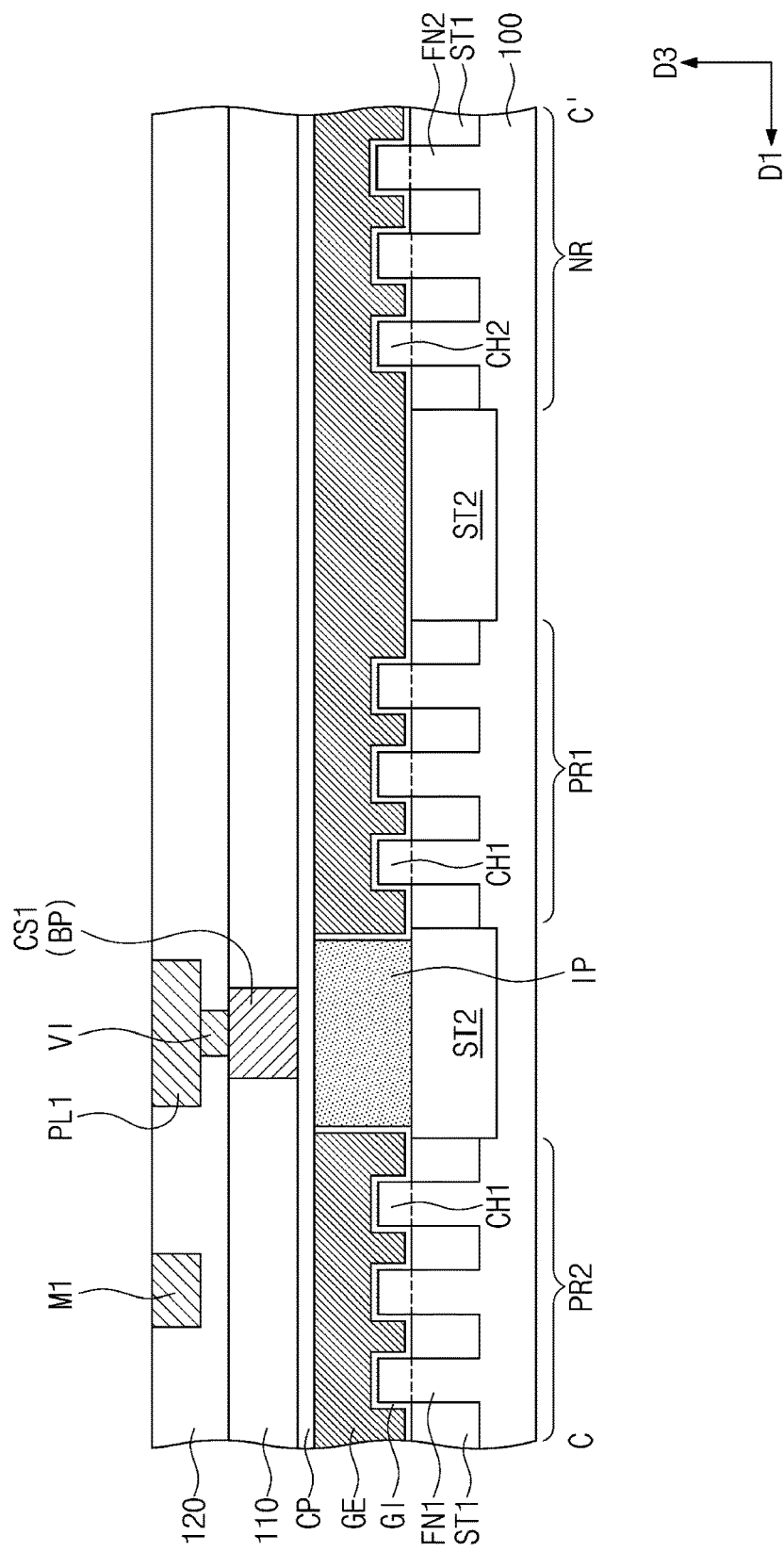
Figure 3D:
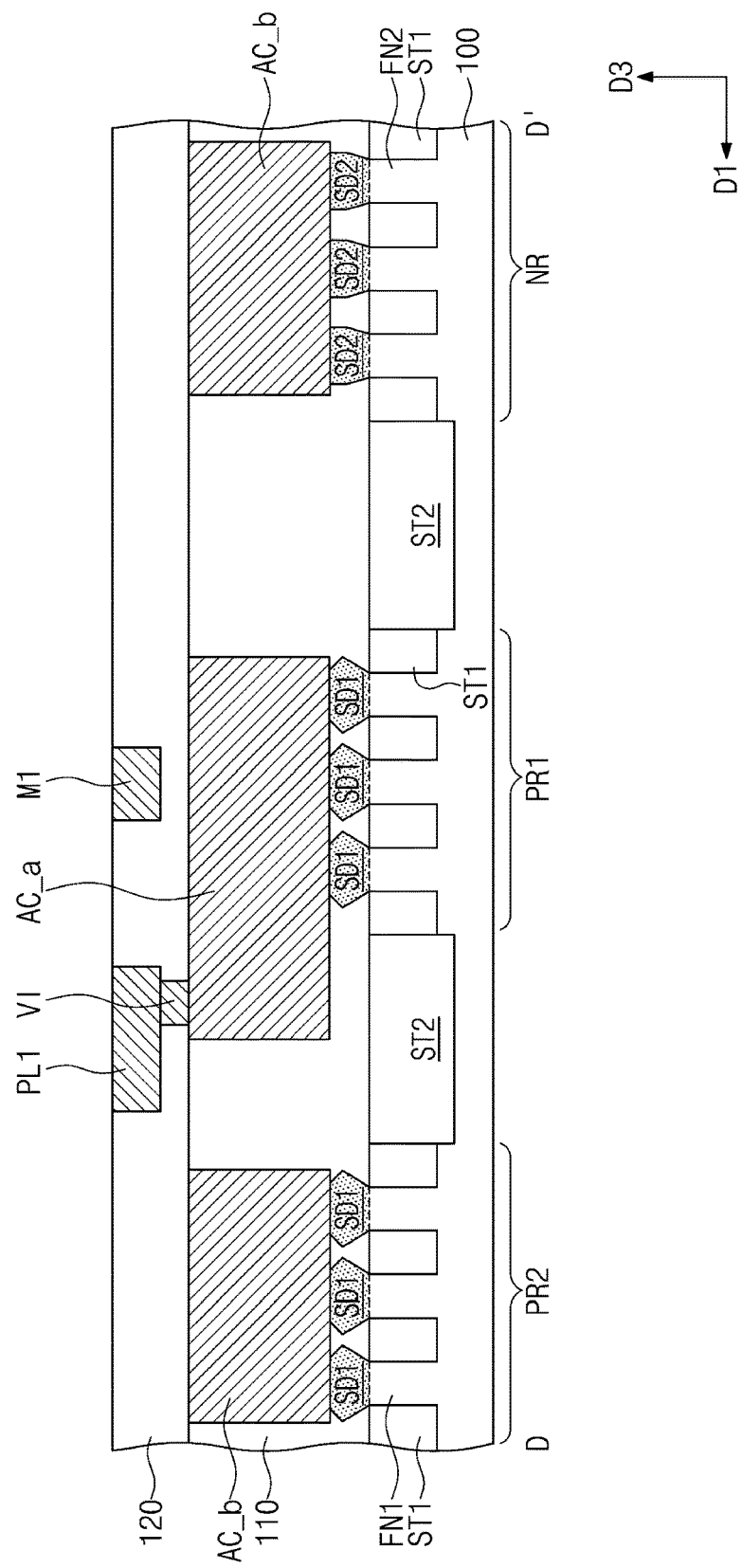

As viewed along the first direction D1, the first source/drain regions SD1 may have cross-sections different from those of the second source/drain regions SD2 (see FIG. 3D). For example, the first source/drain regions SD1 may include silicon-germanium, and the second source/drain regions SD2 may include silicon.

Gate electrodes GE may be provided to extend in the first direction D1, while running across the first and second active patterns FN1 and FN2. The gate electrodes GE may vertically overlap the first and second channel regions CH1 and CH2. Each of the gate electrodes GE may surround opposite sidewalls and the top surface of each of the first and second channel regions CH1 and CH2 (see FIG. 3C). For example, the gate electrodes GE may include one or more of conductive metal nitride (e.g., titanium nitride or tantalum nitride) and metal (e.g., titanium, tantalum, tungsten, copper, or aluminum).

A pair of gate spacers GS may be disposed on opposite sidewalls of each of the gate electrodes GE. The gate spacers GS may extend in the first direction D1 along the gate electrodes GE. The gate spacers GS may have top surfaces higher than those of the gate electrodes GE. The top surfaces of the gate spacers GS may be coplanar with that of a gate capping layer CP which will be discussed below. For example, the gate spacers GS may include one or more of SiCN, SiCON, and SiN. Alternatively, the gate spacers GS may include a multi-layer including two or more of SiCN, SiCON, and SiN.

Gate dielectric layers GI may be interposed between the gate electrodes GE and the first active patterns FN1 and between the gate electrodes GE and the second active patterns FN2. Each of the gate dielectric layers GI may extend along a bottom surface of a corresponding one of the gate electrodes GE. Each of the gate dielectric layers GI may cover the top surface and the opposite sidewalls of each of the first and second channel regions CH1 and CH2. The gate dielectric layers GI may include a high-k dielectric material of which dielectric constant is greater than that of a silicon oxide layer. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A gate capping layer CP may be provided on each of the gate electrodes GE. The gate capping layers CP may extend in the first direction D1 along the gate electrodes GE. The gate capping layers CP may include a material exhibiting an etch selectivity to a first interlayer dielectric layer 110 which will be discussed below. For example, the gate capping layers CP may include one or more of SiON, SiCN, SiCON, and SiN.

The gate electrodes GE on the third and fourth logic cells LC3 and LC4 may be spaced apart in the first direction D1 from the gate electrodes GE on the first and second logic cells LC1 and LC2. For example, the gate electrodes GE may not extend onto the second device isolation layer ST2 between the first and second logic cells LC1 and LC2 and the third and fourth logic cells LC3 and LC4.

Insulation patterns IP may be interposed between the gate electrodes GE on the first and second logic cells LC1 and LC2 and the gate electrodes GE on the third and fourth logic cells LC3 and LC4. The insulation patterns IP may be provided on the second device isolation layer ST2 between the first and second logic cells LC1 and LC2 and the third and fourth logic cells LC3 and LC4. Each of the insulation patterns IP may be interposed between a pair of the gate spacers GS. For example, between a pair of the gate spacers GS, the gate electrode GE on the first logic cell LC1, the insulation pattern IP, and the gate electrode GE on the third logic cell LC3 may be arranged along the first direction D1. The insulation patterns IP may separate the gate electrodes GE on the third and fourth logic cells LC3 and LC4 from the gate electrodes GE on the first and second logic cells LC1 and LC2. The insulation patterns IP may include silicon nitride or silicon oxynitride.

A first interlayer dielectric layer 110 and a second interlayer dielectric layer 120 may be provided to cover the first and second active patterns FN1 and FN2, the gate spacers GS, and the gate capping layers CP. Each of the first and second interlayer dielectric layers 110 and 120 may include a silicon oxide layer or a silicon oxynitride layer.

A pair of the gate electrodes GE may be provided therebetween with active contacts AC that penetrate the first interlayer dielectric layer 110 and are electrically connected to the first and second source/drain regions SD1 and SD2. The active contacts AC may have a bar shape extending in the first direction D1. For example, at least one active contact AC may be connected to a plurality of the first source/drain regions SD1. For example, at least one active contact AC may be connected to a plurality of the second source/drain regions SD2.

The active contacts AC may include first active contacts AC_a and second active contacts AC_b. The first active contacts AC_a may be electrically connected to first and second power lines PL1 and PL2 which will be discussed below. At least one of the second active contacts AC_b may be electrically connected to electrical lines M1 which will discussed below. The first active contacts AC_a may extend onto the second device isolation layer ST2 from the first and second source/drain regions SD1 and SD2. Each portion of the first active contacts AC_a may vertically overlap the second device isolation layer ST2 (see FIG. 3D).

The first interlayer dielectric layer 110 may be penetrated with a first connection structure CS1 and a second connection structure CS2 that are electrically connected to the first source/drain regions SD1. The first and second connection structures CS1 and CS2 may be positioned at the same level as those of the active contacts AC. The first and second connection structures CS1 and CS2 and the active contacts AC may have top surfaces coplanar with that of the first interlayer dielectric layer 110.

The first connection structure CS1 may extend from the first PMOSFET region PR1 of the first logic cell LC1 toward the second PMOSFET region PR2 of the third logic cell LC3. The first connection structure CS1 may electrically connect the first source/drain region SD1 of the first PMOSFET region PR1 to the first source/drain region SD1 of the second PMOSFET region PR2.

The first connection structure CS1 may include a first contact portion CP1, a bridge portion BP, and a second contact portion CP2. The first contact portion CP1 may be electrically connected to the first source/drain region SD1 of the first PMOSFET region PR1, and the second contact portion CP2 may be electrically connected to the first source/drain region SD1 of the second PMOSFET region PR2. The first and second contact portions CP1 and CP2 may not be aligned with each other in the first direction D1. The second contact portion CP2 may be offset from the first contact portion CP1 in a fourth direction D4 crossing the first and second directions D1 and D2. A virtual line (see VL of FIG. 1) may be defined to pass through a center of the first contact portion CP1 and to extend in the first direction D1. The second contact portion CP2 may be offset the virtual line VL in the second direction D2.

The bridge portion BP may extend in the fourth direction D4 on the second device isolation layer ST2 between the first and third logic cells LC1 and LC3. The bridge portion BP may connect the first and second contact portions CP1 and CP2 to each other. As viewed in plan, the bridge portion BP may run between the gate electrode GE of the first logic cell LC1 and the gate electrode GE of the third logic cell LC3. For example, the bridge portion BP may run across the insulation pattern IP on the second device isolation layer ST2. The bridge portion BP may cover the gate capping layer CP and a pair of the gate spacers GS covering the insulation pattern IP.

The second connection structure CS2 may extend from the first PMOSFET region PR1 of the second logic cell LC2 toward the second PMOSFET region PR2 of the fourth logic cell LC4. The second connection structure CS2 may electrically connect the first source/drain region SD1 of the first PMOSFET region PR1 to the first source/drain region SD1 of the second PMOSFET region PR2.

The second connection structure CS2 may include a plurality of first contact portions CP1, a bridge portion BP, and a plurality of second contact portions CP2. The first contact portions CP1 may be connected to the first source/drain regions SD1 of the first PMOSFET region PR1, and the second contact portions CP2 may be connected to the first source/drain regions SD1 of the second PMOSFET region PR2. The first contact portions CP1 and the second contact portions CP2 may not be aligned with each other in the first direction D1. For example, one of the second contact portions CP2 may be aligned in the first direction D1 with the second active contact AC_b between a pair of first contact portions CP1. One of the first contact portions CP1 may be aligned in the first direction D1 with the second active contact AC_b between a pair of second contact portions CP2.

The bridge portion BP may be provided on the second device isolation layer ST2 between the second and fourth logic cells LC2 and LC4. The bridge portion BP may extend in a zigzag path along the second device isolation layer ST2 and electrically connect the first contact portions CP1 to the second contact portions CP2. As viewed in plan, the bridge portion BP may run between the gate electrodes GE of the second logic cell LC2 and the gate electrodes GE of the fourth logic cell LC4. For example, the bridge portion BP may run across a plurality of the insulation patterns IP on the second device isolation layer ST2. The bridge portion BP may cover the gate capping layer CP and the gate spacers GS covering the insulation patterns IP.

The active contacts AC and the first and second connection structures CS1 and CS2 may include the same conductive material as each other. The active contacts AC and the first and second connection structures CS1 and CS2 may include at least one metallic material, for example, aluminum, copper, tungsten, molybdenum, and cobalt.

The second interlayer dielectric layer 120 may be provided therein with first and second power lines PL1 and PL2, electrical lines M1, and vias VI. The first and second power lines PL1 and PL2, the electrical lines M1, and the vias VI may constitute a first metal layer. The first and second power lines PL1 and PL2 and the electrical lines M1 may have top surfaces coplanar with that of the second interlayer dielectric layer 120. The first and second power lines PL1 and PL2 and the electrical lines M1 may have a linear or bar shape extending in the second direction D2.

The first power line PL1 may be provided at a boundary between the first and second logic cells LC1 and LC2 and the third and fourth logic cells LC3 and LC4. The first power line PL1 may be provided on the second device isolation layer ST2 between the first and second PMOSFET regions PR1 and PR2. The second power line PL2 may be provided on the second device isolation layer ST2 adjacent to the NMOSFET region NR. For example, the first power line PL1 may be applied with a power voltage, and the second power line PL2 may be applied with a ground voltage.

The vias VI may be interposed between the electrical lines M1 and the second active contacts AC_b, between the first and second power lines PL1 and PL2 and the first and second connection structures CS1 and CS2, and between the first active contacts AC_a and the first and second power lines PL1 and PL2. The vias VI may electrically connect the electrical lines M1 to the second active contacts AC_b, the first and second power lines PL1 and PL2 to the first and second connection structures CS1 and CS2, and the first active contacts AC_a to the first and second power lines PL1 and PL2.

The via VI on the first connection structure CS1 may be interposed between the first power line PL1 and the bridge portion BP of the first connection structure CS1. The first connection structure CS1 and the via VI may electrically connect the first power line PL1 to the first source/drain region SD1 of the first PMOSFET region PR1 and to the first source/drain region SD1 of the second PMOSFET region PR2.

The vias VI on the second connection structure CS2 may be interposed between the first power line PL1 and the bridge portion BP of the second connection structure CS2. The second connection structure CS2 and the vias VI may electrically connect the first power line PL1 to the first source/drain regions SD1 of the first PMOSFET region PR1 and to the first source/drain regions SD1 of the second PMOSFET region PR2.

The first and second power lines PL1 and PL2 and the electrical lines MI may each be integrally connected to its underlying via VI. For example, the first and second power lines PL1 and PL2 and the electrical lines MI may be formed simultaneously with the vias VI. For example, a dual damascene process may be employed to form the first and second power lines PL1 and PL2 together with the vias VI.

Although not shown, the second interlayer dielectric layer 120 may be provided thereon with additional insulation layers that have therein additional metal layers. The additional metal layers may include routing lines that connect logic cells to each other.

According to embodiments of the present inventive concept, a single connection structure may electrically connect a power line to source/drain regions of different logic cells. A semiconductor device may thus be increased in integration and simplified in manufacture.

FIGS. 4A to 4E illustrate plan views showing examples of connection structures according to exemplary embodiments of the present inventive concept.

Figure 4A:
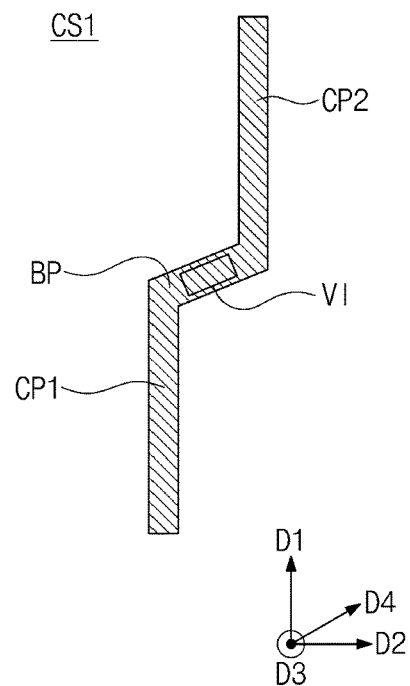
FIGS. 4A to 4E illustrate plan views showing examples of connection structures according to exemplary embodiments of the present inventive concept.

Referring to FIG. 4A, as viewed in plan, the via VI on the first connection structure CS1 may have a bar shape. The via VI on the first connection structure CS1 may extend in the fourth direction D4. For example, an extending direction of the via VI may be parallel to an extending direction of the bridge portion BP.

Figure 4B:
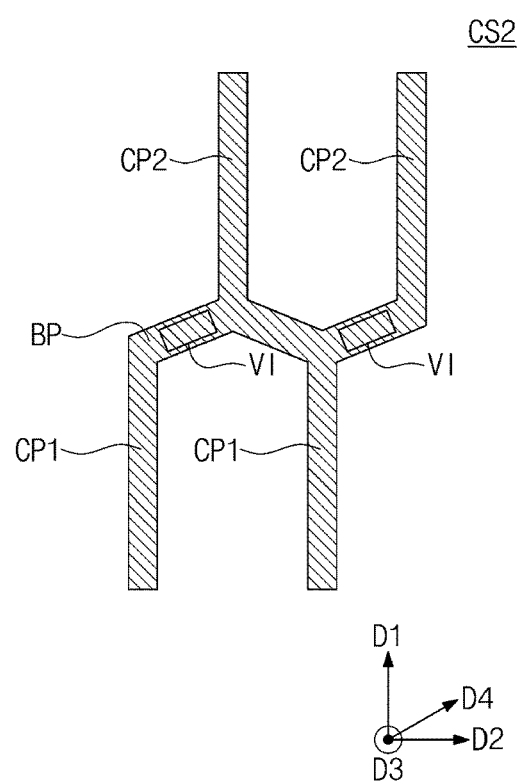

Referring to FIG. 4B, as viewed in plan, the vias VI on the second connection structure CS2 may have a bar shape. The vias VI on the second connection structure CS2 may extend in the fourth direction D4. For example, each extending direction of the vias VI may be parallel to an extending direction of its underlying bridge portion BP.

Figure 4C:
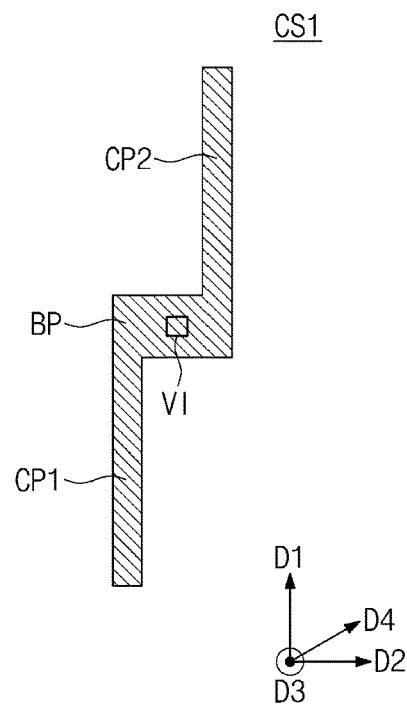

Referring to FIG. 4C, the bridge portion BP of the first connection structure CS1 may extend in the second direction D2. For example, an extending direction of the bride portion BP may be perpendicular to an extending direction (i.e., the first direction D1) of the first contact portion CP1. The extending direction of the bride portion BP may be perpendicular to an extending direction (i.e., the first direction D1) of the second contact portion CP2.

Figure 4D:
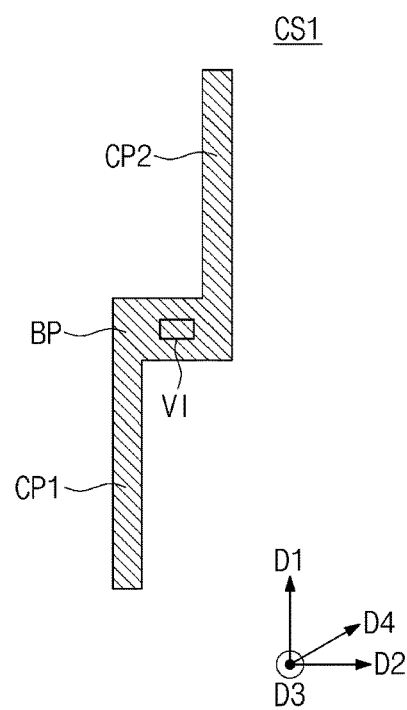

Referring to FIG. 4D, the via VI on the first connection structure CS1 of FIG. 4C may have a bar shape. The via VI on the first connection structure CS1 may extend in the second direction D2. For example, an extending direction of the via VI may be parallel to an extending direction of the bridge portion BP.

Figure 4E:
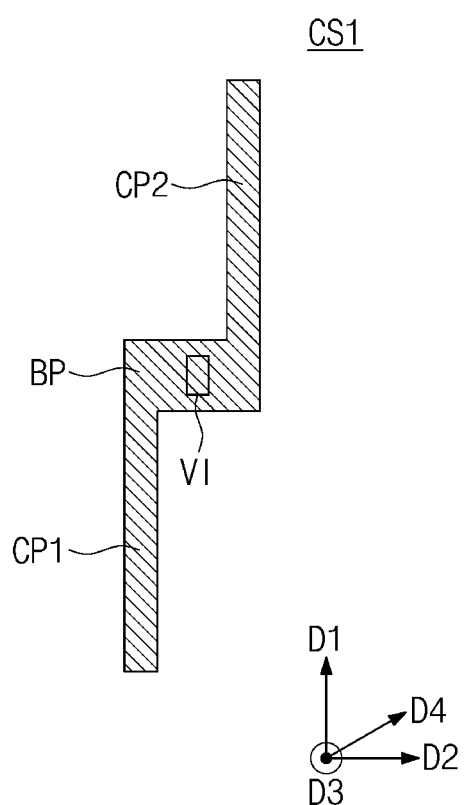

Referring to FIG. 4E, the via VI on the first connection structure CS1 of FIG. 4C may have a bar shape. The via VI on the first connection structure CS1 may extend in the first direction D1. For example, an extending direction of the via VI may be parallel to extending directions of the first and second contact portions CP1 and CP2.

Figure 5:
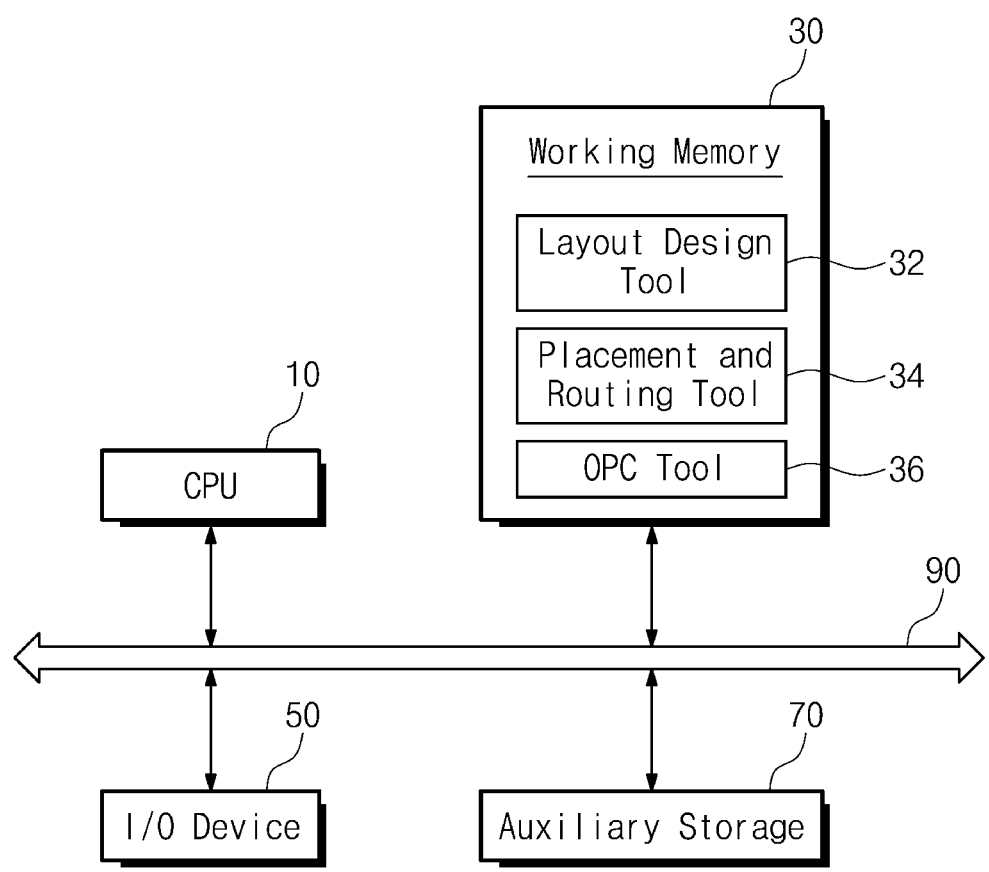
FIG. 5 illustrates a block diagram showing a computer system that designs a semiconductor device according to exemplary embodiments of the present inventive concept.

FIG. 5 illustrates a block diagram showing a computer system that designs a semiconductor device according to exemplary embodiments of the present inventive concept.

Referring to FIG. 5, a computer system may include a CPU 10, a working memory 30, an I/O device 50, and an auxiliary storage 70. The computer system may be provided in the form of a dedicated device for designing a layout according to exemplary embodiments of the present inventive concept. Moreover, the computer system may be configured to drive various design and verification simulation programs.

The CPU 10 may drive a variety of software (e.g., application programs, an operating system, device drivers, etc.) in the computer system. The CPU 10 may run an operating system loaded in the working memory 30. The CPU 10 may execute various application programs driven based on the operating system. For example, the CPU 10 may process a layout design tool 32, a placement and routing tool 34, and/or an OPC tool 36 loaded in the working memory 30.

The operating system or application programs may be loaded in the working memory 30. When the computer system is booted up, based on booting sequence, an operating system image (not shown) stored in the auxiliary storage 70 may be loaded to the working memory 30. Overall input/output operations of the computer system may be managed by the operating system. Likewise, the working memory 30 may be loaded with the application programs that are selected by a user or provided for a basic service.

The layout design tool 32 prepared for a layout design may be loaded from the auxiliary storage 70 to the working memory 30. The working memory 30 may be loaded from the auxiliary storage 70 with the placement and routing tool 34 that places designed standard cells, rearranges inner line patterns in the placed standard cells, and routes the placed standard cells. The working memory 30 may be loaded from the auxiliary storage 70 with the OPC tool 36 that performs an optical proximity correction (OPC) on designed layout data.

The layout design tool 32 may include a biasing function by which specific layout patterns are changed in shapes and positions defined by a design rule. In addition, the layout design tool 32 may perform a design rule check (DRC) under the changed biasing data condition. The working memory 30 may be either a volatile memory such as SRAM (Static Random Access Memory) or DRAM (Dynamic Random Access Memory), or a nonvolatile memory such as PRAM (Phase change Random Access Memory), MRAM (Magnetic Random Access Memory), ReRAM (Resistance Random Access Memory), FRAM (Ferroelectric Random Access Memory) or NOR Flash memory.

The I/O device 50 may control user input/output operations of user interfaces. For example, the I/O device 50 may include a keyboard or a monitor, allowing a designer to put relevant information. The user may use the I/O device 50 to receive information about a semiconductor region or data paths requiring adjusted operating characteristics. The I/O device 50 may display a progress status or a process result of the OPC tool 36.

The auxiliary storage 70 may serve as a storage medium for the computer system. The auxiliary storage 70 may store the application programs, the operating system image, and various data. The auxiliary storage 70 may be provided in the form of one among memory cards (e.g., MMC, eMMC, SD, Micro SD, etc.) and a hard disk drive (HDD). The auxiliary storage 70 may include a NAND Flash memory having a large memory capacity. Alternatively, the auxiliary storage 70 may include a NOR Flash memory or a next-generation volatile memory such as PRAM, MRAM, ReRAM, and FRAM.

A system interconnector 90 may be provided to serve as a system bus for providing a network in the computer system. The CPU 10, the working memory 30, the I/O device 50, and the auxiliary storage 70 may be electrically connected through the system interconnector 90, and may exchange data with each other. The system interconnector 90 may not be limited to the above descriptions. For example, the system interconnector 90 may further include additional elements for increasing efficiency in data communication.

Figure 6:
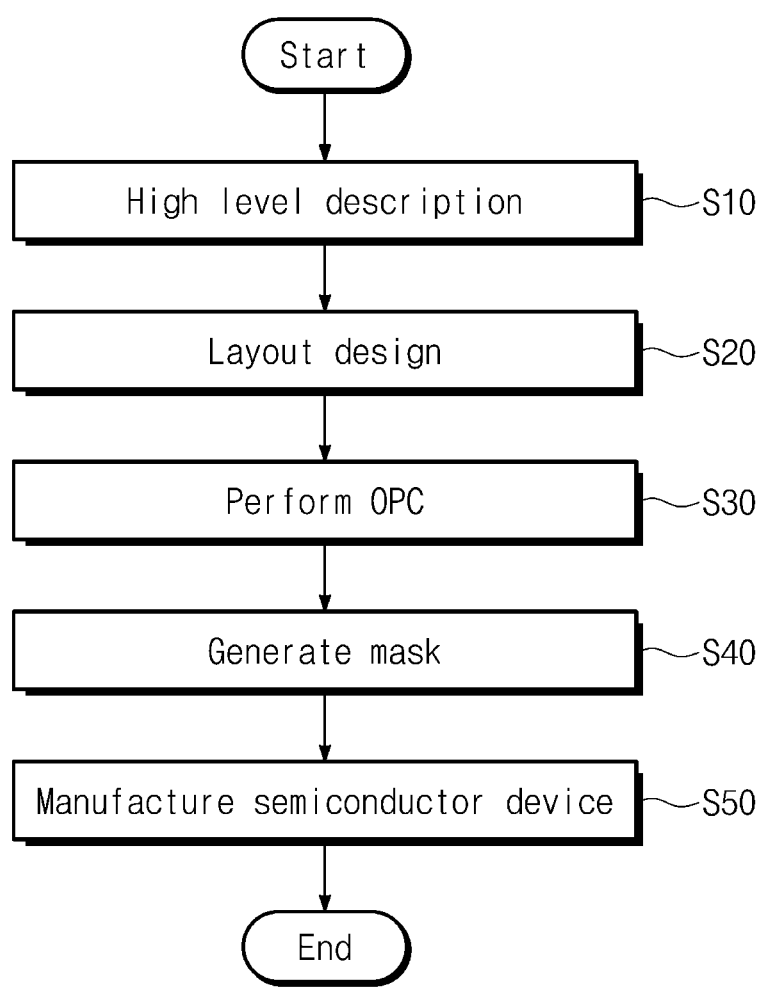
FIG. 6 illustrates a flow chart showing a method of designing and manufacturing a semiconductor device according to exemplary embodiments of the present inventive concept.

FIG. 6 illustrates a flow chart showing a method of designing and manufacturing a semiconductor device according to exemplary embodiments of the present inventive concept.

Referring to FIG. 6, a high-level design step of a semiconductor integrated circuit may be performed using the computer system discussed with reference to FIG. 5 (S10). The high-level design step may mean that an integrated circuit corresponding to a design target is described with a high-level language of a hardware description language. For example, the high-level language such as C language may be used in the high-level design step. A register transfer level (RTL) coding or simulation may be used to express circuits designed by the high-level design step. In addition, codes created by the RTL coding may be converted into a netlist, and the netlist may be synthesized to describe an entire semiconductor device. The synthesized schematic circuit may be verified by a simulation tool, and an adjustment process may be performed based on the verified result.

A layout design step may be performed to implement on a silicon substrate a semiconductor integrated circuit that is logically completed (S20). For example, the layout design step may be performed based on the schematic circuit synthesized in the high-level design step or the netlist corresponding to the schematic circuit. The layout design step may include a routing process that places and connects various standard cells provided from a cell library, based on a prescribed design rule.

The cell library for the layout design step may contain information on operation, speed, and power consumption of the standard cells. A cell library for representing a layout of a specific gate-level circuit as a layout may be defined in the layout design tool 32. The layout may be prepared to define shapes or dimensions of patterns constituting transistors and metal lines that will be actually formed on a silicon substrate. For example, in order to actually form an inverter circuit on a silicon substrate, it may be necessary to appropriately place or describe layout patterns such as PMOS, NMOS, N-WELL, gate electrodes, and metal lines thereon. For this, a search may be first performed to select a suitable one of inverters predefined in the cell library.

A routing process may be performed on the selected and placed standard cells. For example, high-level lines (routing patterns) may be provided on the placed standard cells. The standard cells may be well-designedly connected to each other through the routing process. The placement and routing of the standard cells may be automatically performed by the placement and routing tool 34.

After the routing process, a verification process may be performed on the layout to check whether any portion of the schematic circuit violates the given design rule. The verification process may include a design rule check (DRC) for verifying whether the layout meets the given design rule, an electrical rule check (ERC) for verifying whether there is an issue of an electrical disconnection in the layout, and a layout vs. schematic (LVS) for verifying whether the layout is coincident with the gate-level netlist.

An optical proximity correction (OPC) step may be performed (S30). A photolithography process may be employed to realize on a silicon substrate the layout patterns obtained from the layout design step. The optical proximity correction step may be a technique for correcting an unintended phenomenon occurred in the photolithography process. For example, the optical proximity correction step may correct an undesirable phenomenon such as refraction or process side effects caused by characteristics of light in an exposure process using the layout patterns. When the optical proximity correction step is performed, the designed layout patterns may be slightly changed (or biased) in their shapes and positions.

A photomask may be generated based on the layout changed by the optical proximity correction step (S40). The photomask may generally be manufactured by describing the layout patterns using a chromium layer coated on a glass substrate.

The generated photomask may be used to manufacture a semiconductor device (S50). Various exposure and etching processes may be repeatedly performed in manufacturing the semiconductor device using the photomask. Through these processes described above, patterns defined in the layout design step may be sequentially formed on a silicon substrate.

Figure 7:
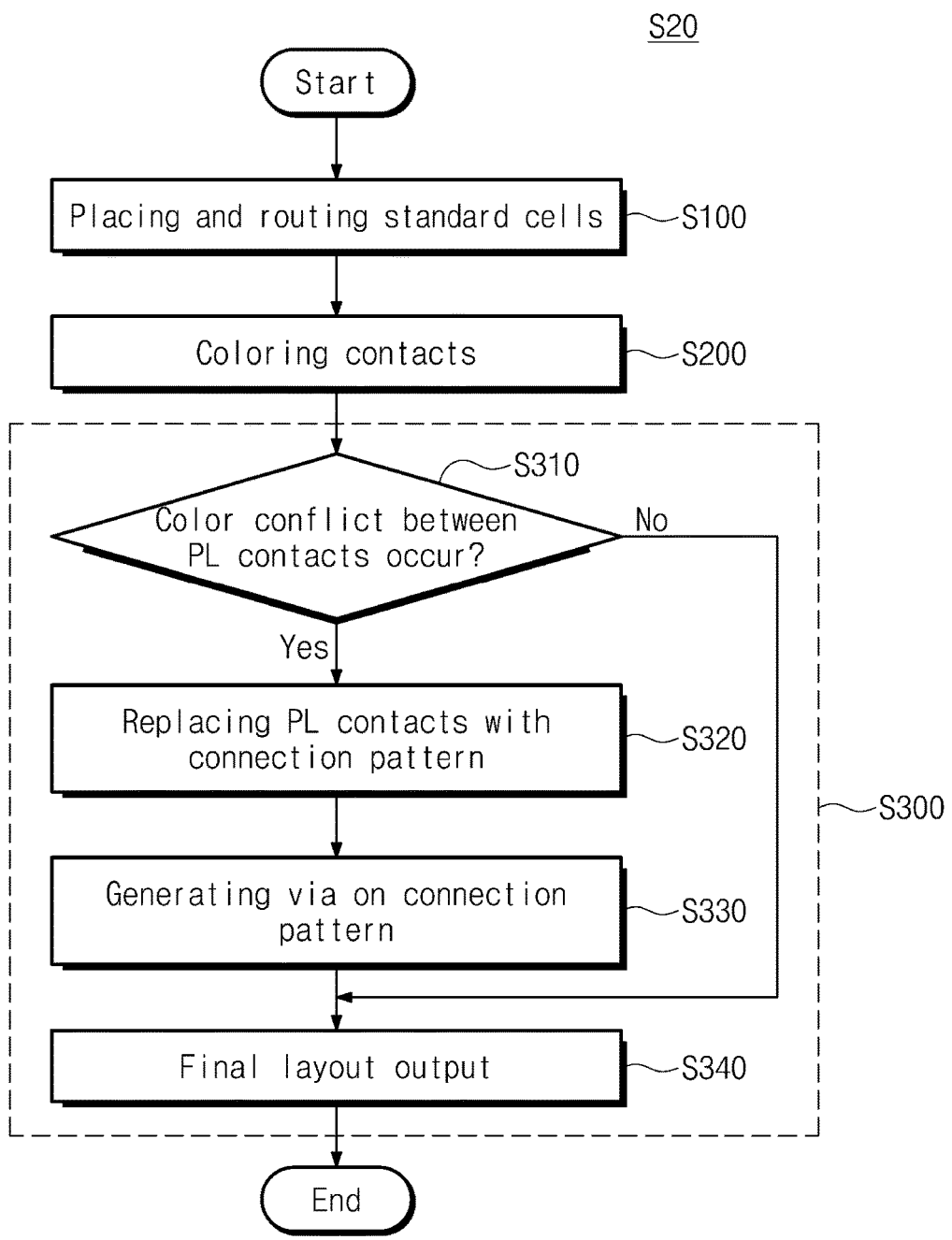
FIG. 7 illustrates a flow chart showing a layout design step S20 of FIG. 6.

FIG. 7 illustrates a flow showing the layout design step S20 of FIG. 6. FIGS. 8 to 11 illustrate layouts showing the layout design step S20 of FIG. 7 according to exemplary embodiments of the present inventive concept.

Figure 8:
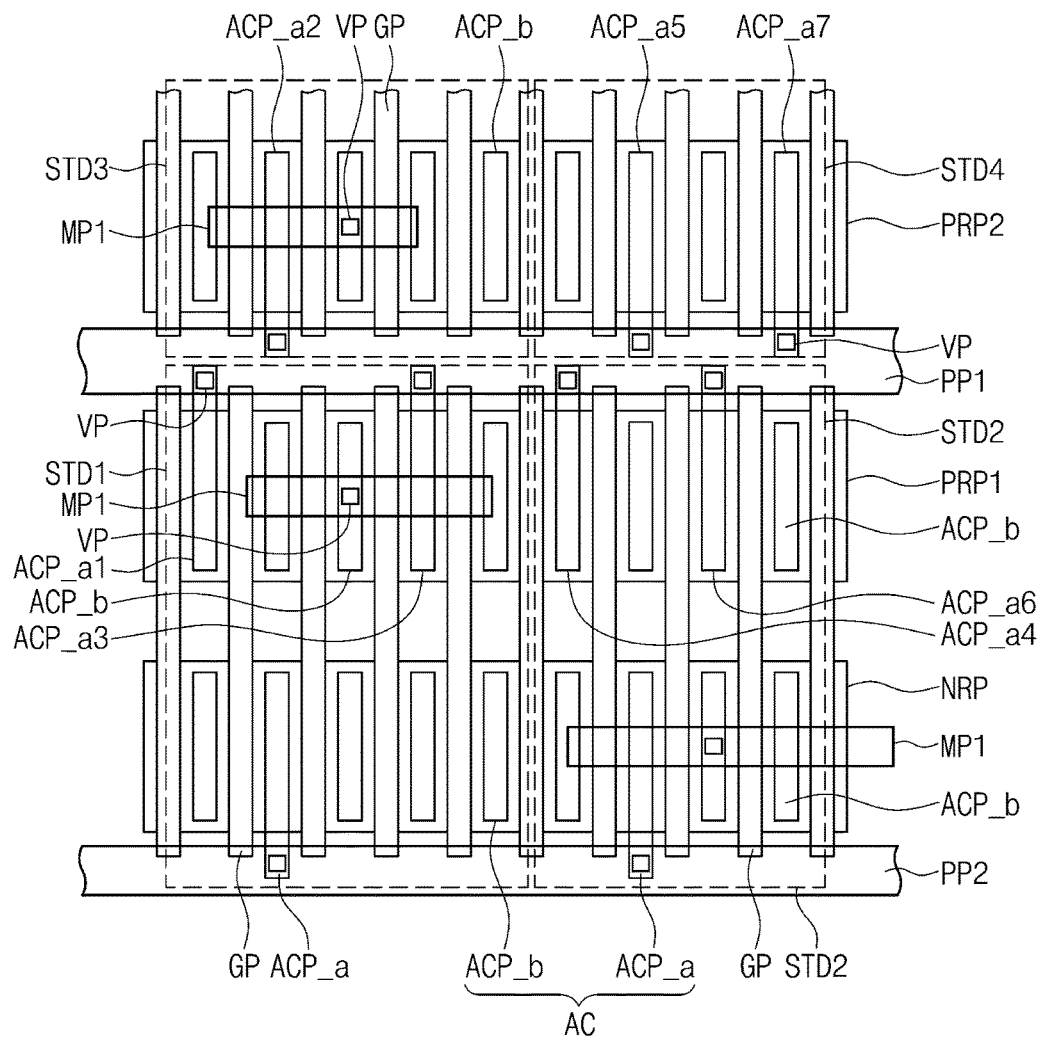
FIGS. 8 to 11 illustrate layouts showing a layout design step S20 of FIG. 7 according to exemplary embodiments of the present inventive concept.

Referring to FIGS. 7 and 8, first to fourth standard cells STD1 to STD4 may be placed, and a routing process may be performed on the placed first to fourth standard cells STD1 to STD4 (S100). The first and second standard cells STD1 and STD2 may be linearly arranged in a second direction D2. The third and fourth standard cells STD3 and STD4 may be linearly arranged in the second direction D2. The first and third standard cells STD1 and STD3 may be linearly arranged in a first direction D1. The second and fourth standard cells STD2 and STD4 may be linearly arranged in the first direction D1.

The first to fourth standard cells STD1 to STD4 may include active regions PRP1, PRP2, and NRP, gate patterns GP, contact patterns ACP, line patterns MP1, first and second power patterns PP1 and PP2, and via patterns VP. The active regions PRP1, PRP2, NRP may extend in the second direction D2 crossing (e.g., perpendicular to) the first direction D1. The active regions PRP1, PRP2, and NRP may be spaced apart from each other in the first direction D1. The active regions PRP1, PRP2, and NRP may include a first PMOSFET active region PRP1, a second PMOSFET active region PRP2, and an NMOSFET active region NRP.

The gate patterns GP may run across the active regions PRP1, PRP2, and NRP and extend in the first direction D1. The gate patterns GP may be arranged along the second direction D2. The gate patterns GP on the second PMOSFET active region PRP2 may be spaced apart in the first direction D1 from the gate patterns GP on the first PMOSFET active region PRP1.

The contact patterns ACP may lie between the gate patterns GP. The contact patterns ACP may have a bar shape extending in the first direction D1. The contact patterns ACP may include first contact patterns ACP_a and second contact patterns ACP_b. The first contact patterns ACP_a may extend from the active regions PRP1, PRP2, and NRP toward the first and second power patterns PP1 and PP2. For example, each of the first contact patterns ACP_a may partially overlap each of the first and second power patterns PP1 and PP2. The second contact patterns ACP_b may be restrictedly placed only on the active regions PRP1, PRP2, and NRP. The second contact patterns ACP_b may be spaced apart from the first and second power patterns PP1 and PP2.

For example, the first contact patterns ACP_a may include first to seventh patterns ACP_a1 to ACP_a7. The first PMOSFET active region PRP1 may be provided thereon with the first, third, fourth, and sixth patterns ACP_a1, ACP_a3, ACP_a4, and ACP_a6. The second PMOSFET active region PRP2 may be provided thereon with the second, fifth, and seventh patterns ACP_a2, ACP_a5, and ACP_a7.

The line patterns MP1, the first and second power patterns PP1 and PP2, and the via patterns VP may be positioned at a higher level than those of the gate patterns GP. The line patterns MP1, the first and second power patterns PP1 and PP2, and the via patterns VP may defined a first metal layer. The line patterns MP1 and the first and second power patterns PP1 and PP2 may extend along the second direction D2.

The via patterns VP may be placed on zones where the first and second power patterns PP1 and PP2 may overlap the first contact patterns ACP_a. The via patterns VP may be placed on zones where the line patterns MP1 may overlap the second contact patterns ACP_b. The via patterns VP may define the vias (see VI of FIG. 2) through which the first and second power lines (see PL1 and PL2 of FIG. 2) may be vertically connected to the first active contacts (see AC_a of FIG. 2). The via patterns VP may define the vias (see VI of FIG. 2) through which the electrical lines (see MI1 of FIG. 2) may be vertically connected to the second active contacts (see AC_b of FIG. 2).

Although not shown, the routing process on the first to fourth standard cells STD1 to STD4 may include placing routing patterns at a higher level than those of the line patterns MP1 and the first and second power patterns PP1 and PP2.

Figure 9:
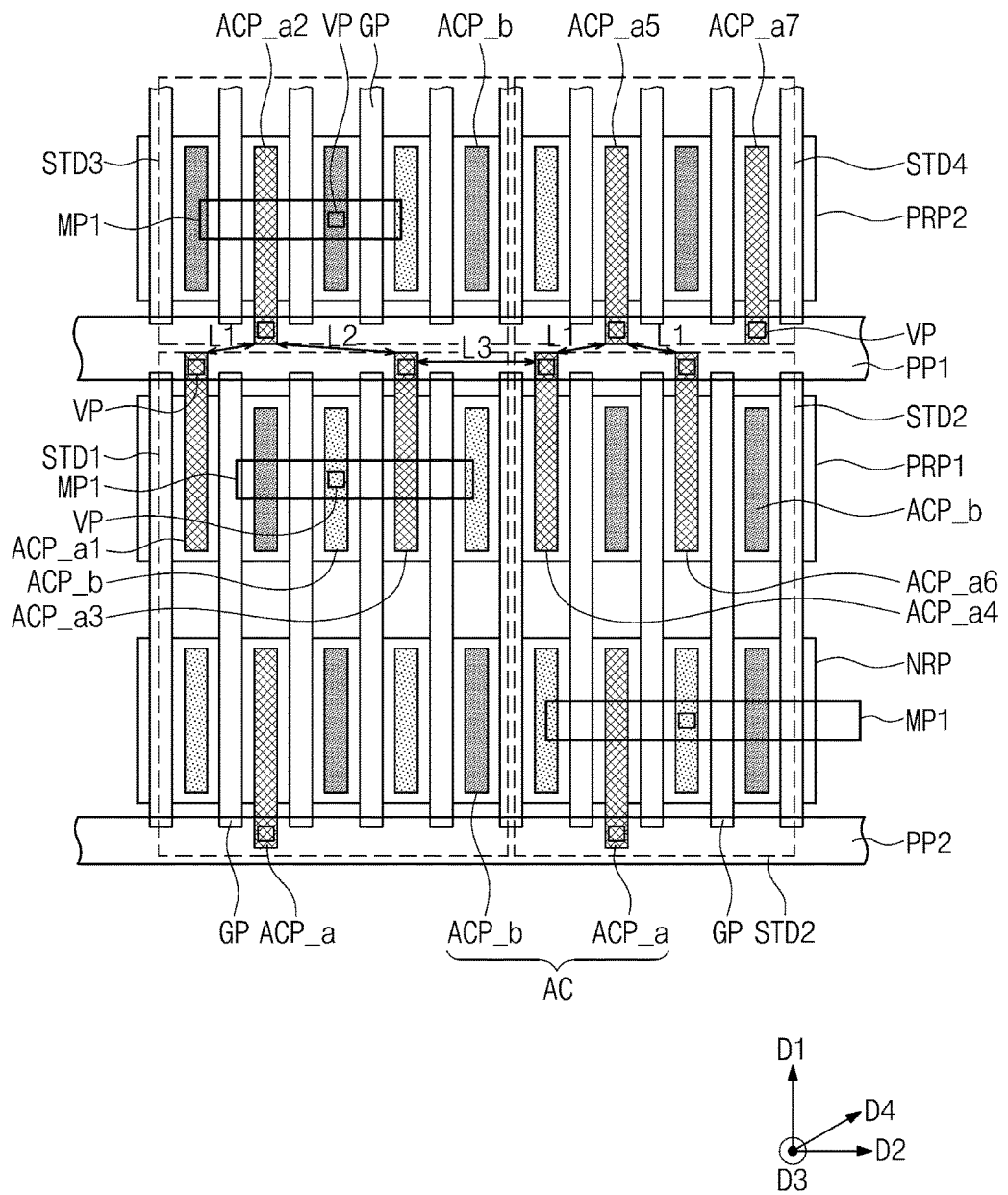

Referring to FIGS. 7 and 9, a coloring step may be performed on the contact patterns ACP of the first to fourth standard cells STD1 to STD4 (S200). The coloring step may be performed considering a patterning resolution limit of a photolithography process. For example, the contact patterns ACP may not all be formed on a substrate by a single photolithograph process. This may occur when the contact patterns ACP are spaced apart at a spacing less than the patterning resolution limit. In this case, the contact patterns ACP may all be formed on a substrate by performing the photolithography process more than once. For the above reason, the coloring step may include dividing the contact patterns ACP into a plurality of groups.

FIG. 9 exemplarily shows a result of the coloring step on the contact patterns ACP. The contact patterns ACP included in the same group may be expressed by the same color (e.g., the same hatching). For example, the first contact patterns ACP_a may be identically colored to express a first group. The second contact patterns ACP_b may be colored to express a second group and a third group. One of two neighboring second contact patterns ACP_b may be included in the second group, and the other of two neighboring second contact patterns ACP_b may be included in the third group.

The first and second patterns ACP_a1 and ACP_a2 of the first group may be spaced apart from each other at a first distance L1. The second and third patterns ACP_a2 and ACP_a3 of the first group may be spaced apart from each other at a second distance L2. The third and fourth patterns ACP_a3 and ACP_a4 of the first group may be spaced apart from each other at a third distance L3. The fourth and fifth patterns ACP_a4 and ACP_a5 of the first group may be spaced apart from each other at the first distance L1. The fifth and sixth patterns ACP_a5 and ACP_a6 of the first group may be spaced apart from each other at the first distance L1. The first distance L1 may be less than the patterning resolution limit. The second and third distances L2 and L3 may be greater than the patterning resolution limit.

After the coloring step (S200), a mask data preparation step may be performed (S300). In the mask data preparation step S300, overall data on designed layouts obtained in designing a semiconductor device may be gathered and then an optical proximity correction (OPC) may be performed.

For example, the mask data preparation step S300 may include a step S310 in which whether or not a color conflict may occur between the first contact patterns ACP_a in a first layout of FIG. 9, a step S320 in which the color-conflicted first contact patterns ACP_a may be replaced with connection patterns CSP1 and CSP2, a step S330 in which the via patterns VP may be generated on the connection patterns CSP1 and CSP2, and a step 340 in which a final second layout may be output from the first layout through the above steps.

Figure 10:
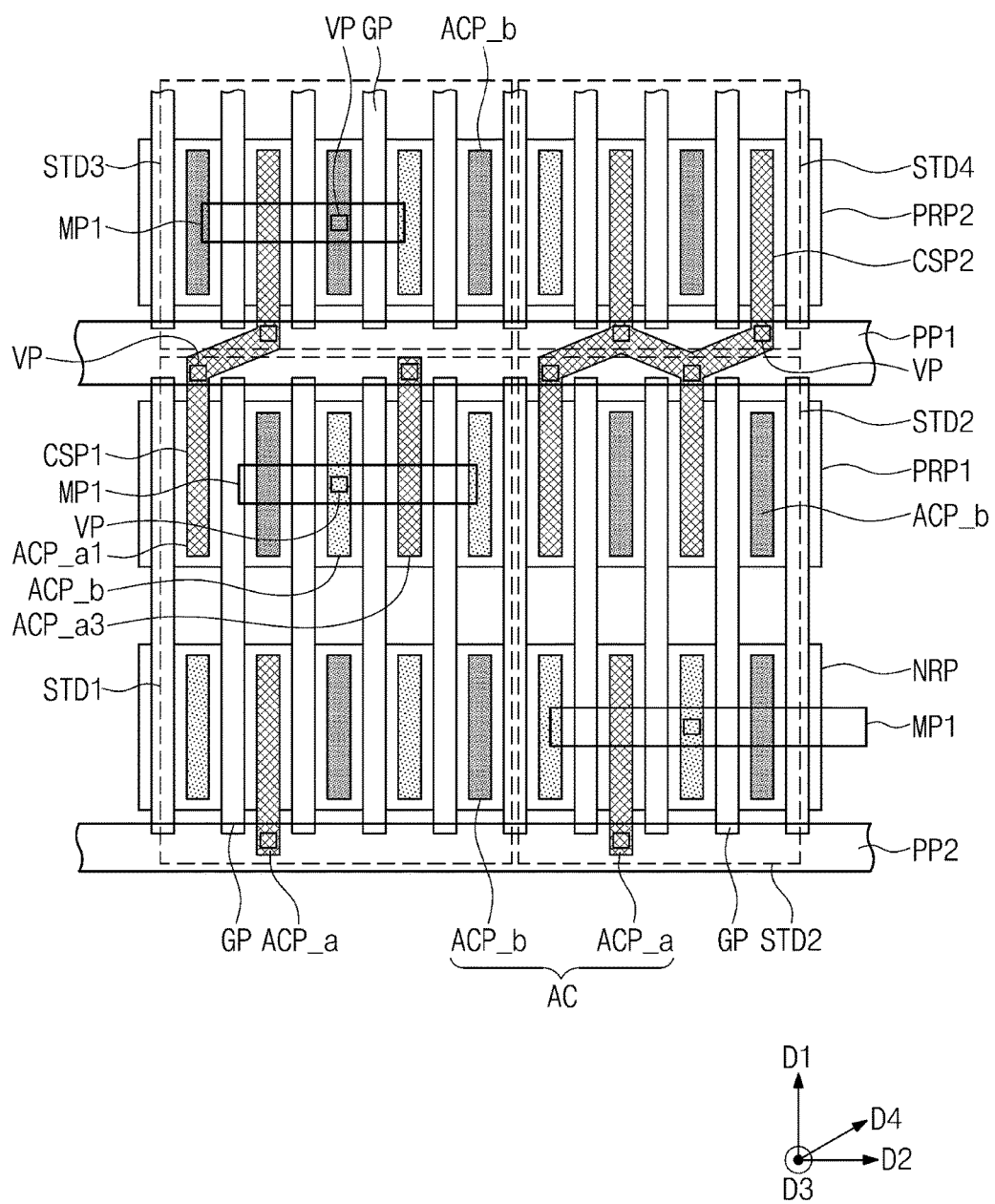

For example, referring to FIGS. 7 and 10, the color-conflicted first contact patterns ACP_a may be replaced with the connection patterns CSP1 and CSP2 (S310 and S320). The color conflict may mean that the distance between the first contact patterns ACP_a of the first group is less than the patterning resolution limit. For example, the color conflict may occur between the first and second patterns ACP_a1 and ACP_a2 of FIG. 9. The color conflict may occur between the fourth and fifth patterns ACP_a4 and ACP_a5 of FIG. 9. The color conflict may occur between the fifth and sixth patterns ACP_a5 and ACP_a6 of FIG. 9. The color conflict may occur between the sixth and seventh patterns ACP_a6 and ACP_a7 of FIG. 9. In contrast, no color conflict may occur between the second and third patterns ACP_a2 and ACP_a3 of FIG. 9. No color conflict may occur between the third and fourth patterns ACP_a3 and ACP_a4 of FIG. 9. It may be less likely that the color-conflicted first contact patterns ACP_a of FIG. 9 are all formed on a substrate by a single photolithography process using a single photomask. An additional color may thus be provided to the color-conflicted first contact patterns ACP_a, thereby additionally forming a fourth group. However, in this case, process inefficiency may occur because four photomasks may be necessarily fabricated from the first to fourth groups and the photolithography process may be inevitably performed at four times.

According to embodiments of the present inventive concept, a layout correction may be performed instead of adding the fourth group. For example, a single first connection pattern CSP1 may take the place of the first and second patterns ACP_a1 and ACP_a2 that have experienced the color conflict. A single second connection pattern CSP2 may take the place of the fourth to seventh patterns ACP_a4 to ACP_a7 that have experienced the color conflict. Accordingly, distances between the patterns of the first group may become greater than the patterning resolution limit, and as a result, the patterns of the first group may be implemented on a substrate by a single photolithography process using only one photomask.

The first contact patterns ACP_a without the color conflict may define the first active contacts (see AC_a of FIG. 2). The second contact patterns ACP_b may define the second active contacts (see AC_b of FIG. 2). The first and second connection patterns CSP1 and CSP2 may define the first and second connection structures (see CS1 and CS2 of FIG. 2).

Figure 11:
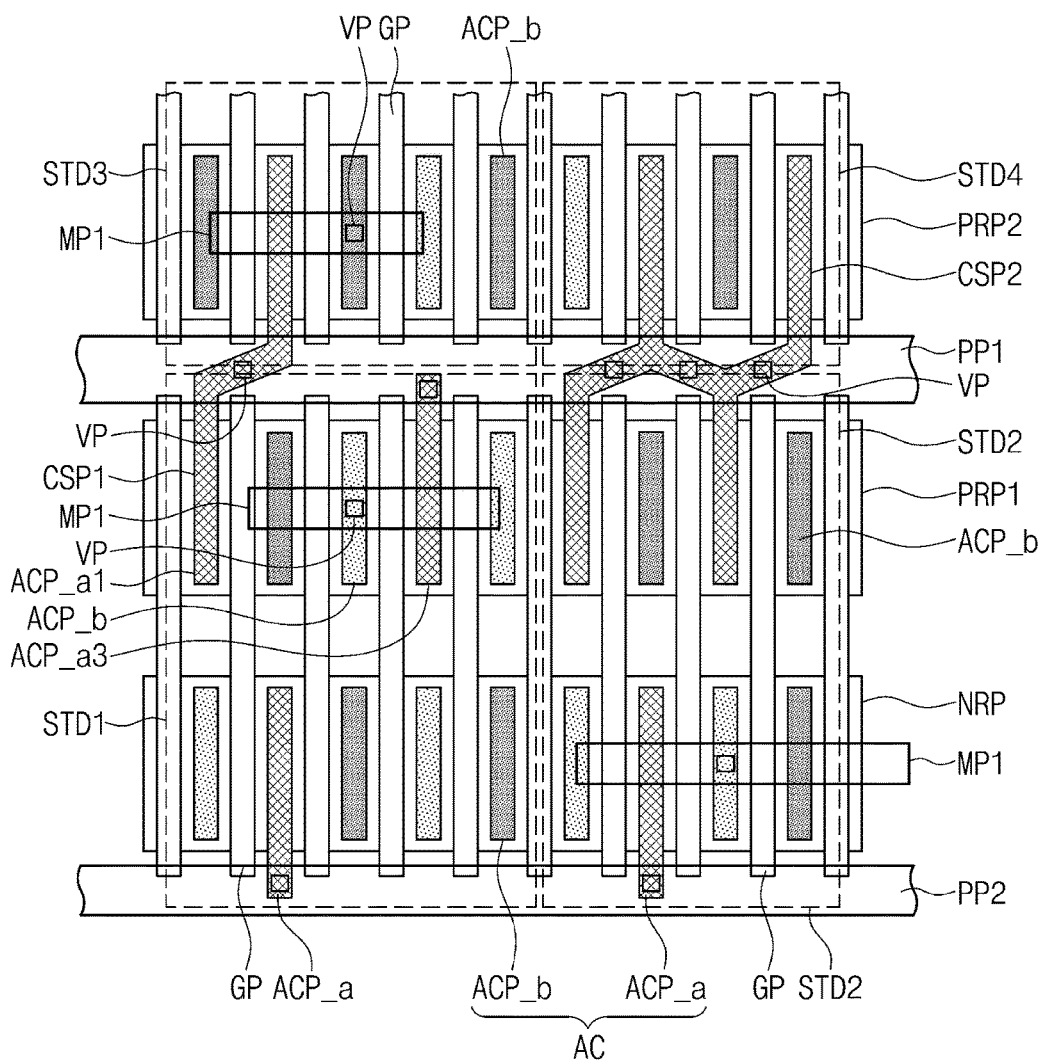

Referring to FIGS. 7 and 11, the old via patterns VP may be erased and then new via patterns VP may be generated on the first and second connection patterns CSP1 and CSP2 (S330). The newly generated via patterns VP are not limited in number and shape. For example, the new via patterns VP may define the variously shaped vias VI discussed above with reference to FIGS. 4A to 4E.

A layout shown in FIG. 11 may be output as the second layout (S340). An optical proximity correction may be performed on the output second layout, and thereby a photomask may be fabricated. The fabricated photomask may be used for a semiconductor process, and therefore a semiconductor device may be manufactured (see FIG. 6). According to embodiments of the present inventive concept, three photomasks may be fabricated from the first to third groups, and then a photolithography process may be carried out three times. This will be further discussed in detail below with reference to FIGS. 16 to 21D. Consequently, in a method of designing and manufacturing a semiconductor device, since it is possible to reduce the number of the photomask for forming contacts coupled to the source/drain regions and the number of the photolithography process, a semiconductor process may be performed efficiently.

FIGS. 12, 14, 16, 18, and 20 illustrate plan views showing a method of manufacturing a semiconductor device according to exemplary embodiments of the present inventive concept. FIGS. 13A, 15A, 17A, 19A, and 21A illustrate cross-sectional views taken along line A-A' of FIGS. 12, 14, 16, 18, and 20, respectively. FIGS. 13B, 15B, 17B, 19B, and 21B illustrate cross-sectional views corresponding to line B-B' of FIGS. 12, 14, 16, 18, and 20, respectively. FIGS. 15C, 17C, 19C, and 21C illustrate cross-sectional views corresponding to line C-C' of FIGS. 14, 16, 18, and 20, respectively. FIGS. 15D, 17D, 19D, and 21D illustrate cross-sectional views corresponding to line D-D' of FIGS. 14, 16, 18, and 20, respectively. According to embodiments of the present inventive concept, the second layout of FIG. 11 may be used to actually form patterns on a substrate.

Figure 12:
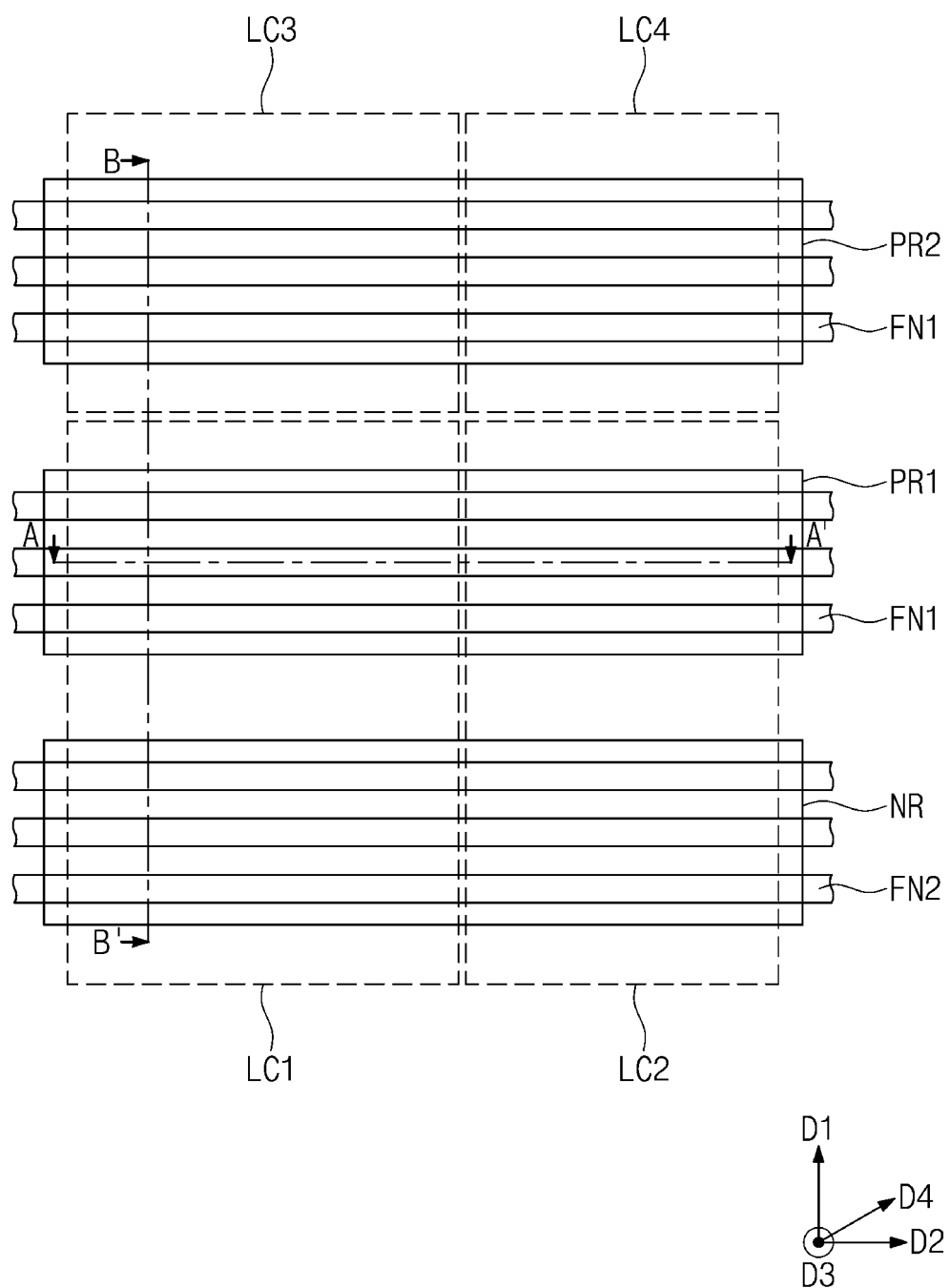
FIGS. 12, 14, 16, 18, and 20 illustrate plan views showing a method of manufacturing a semiconductor device according to exemplary embodiments of the present inventive concept.
Figure 14:
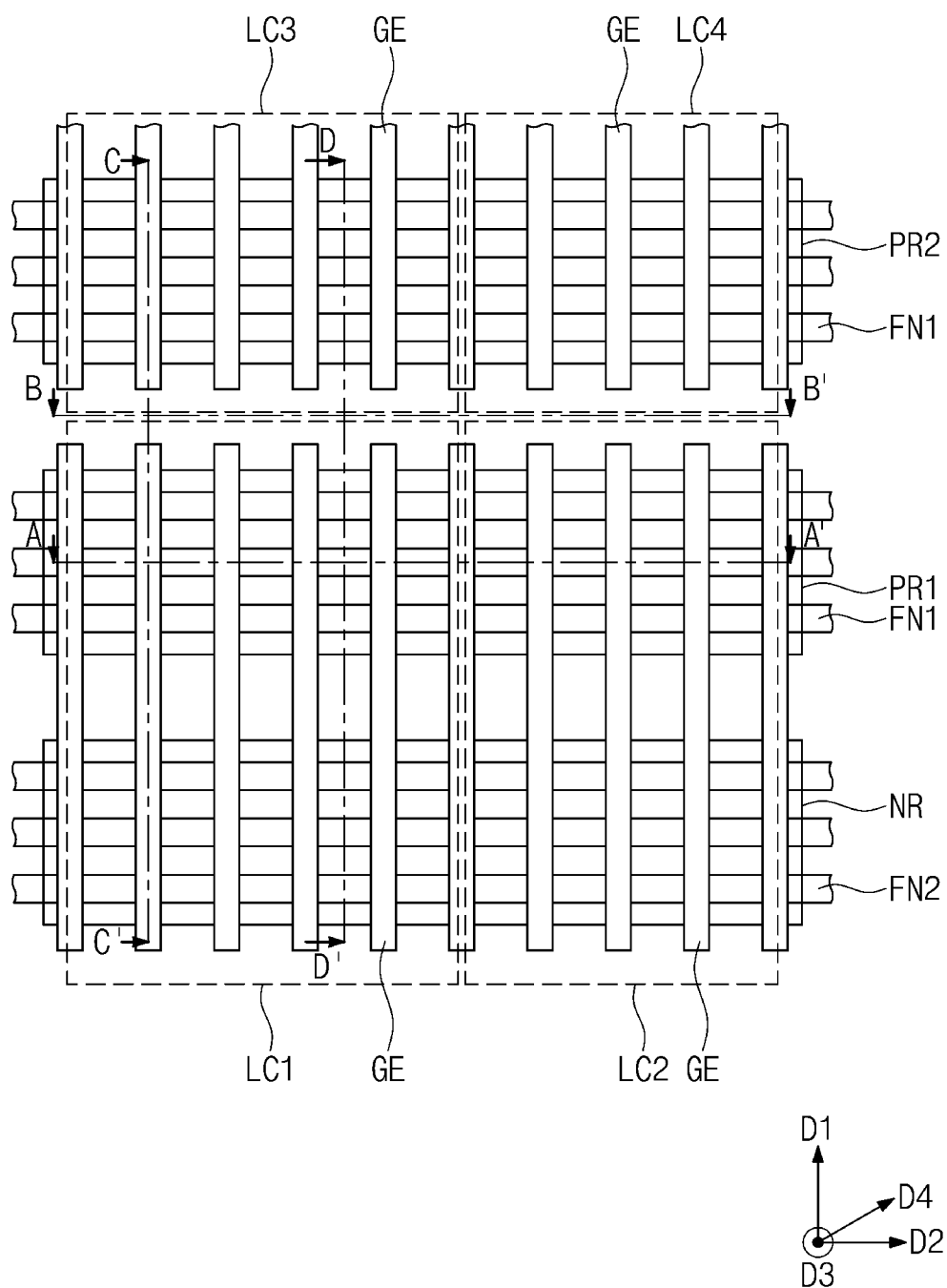
Figure 15A:
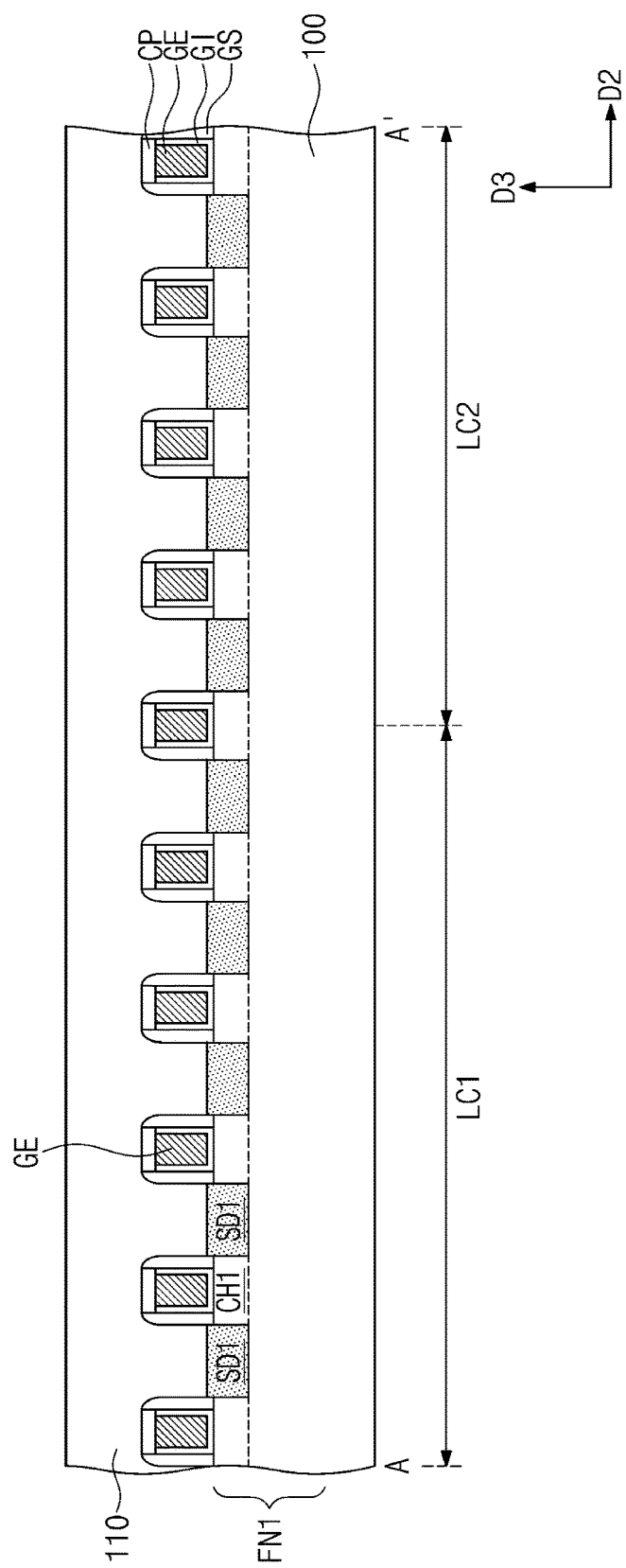
Figure 15B:
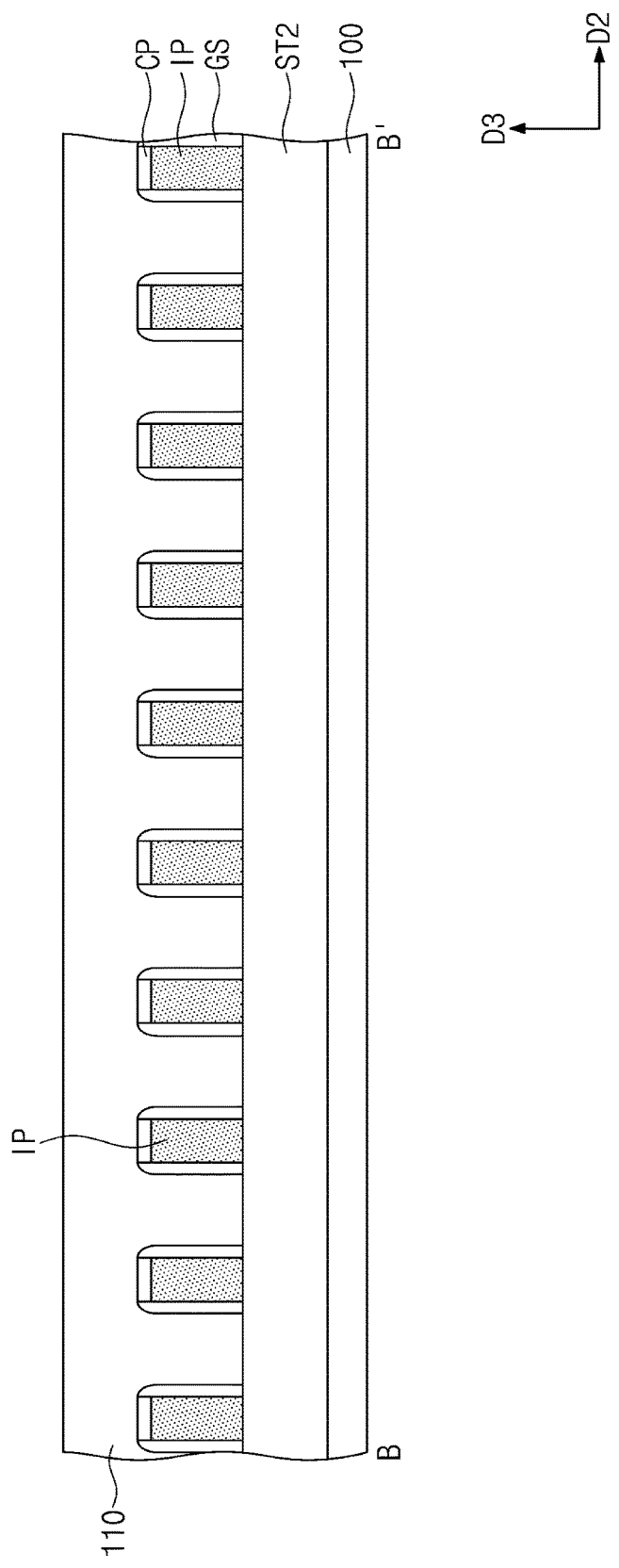
Figure 15C:
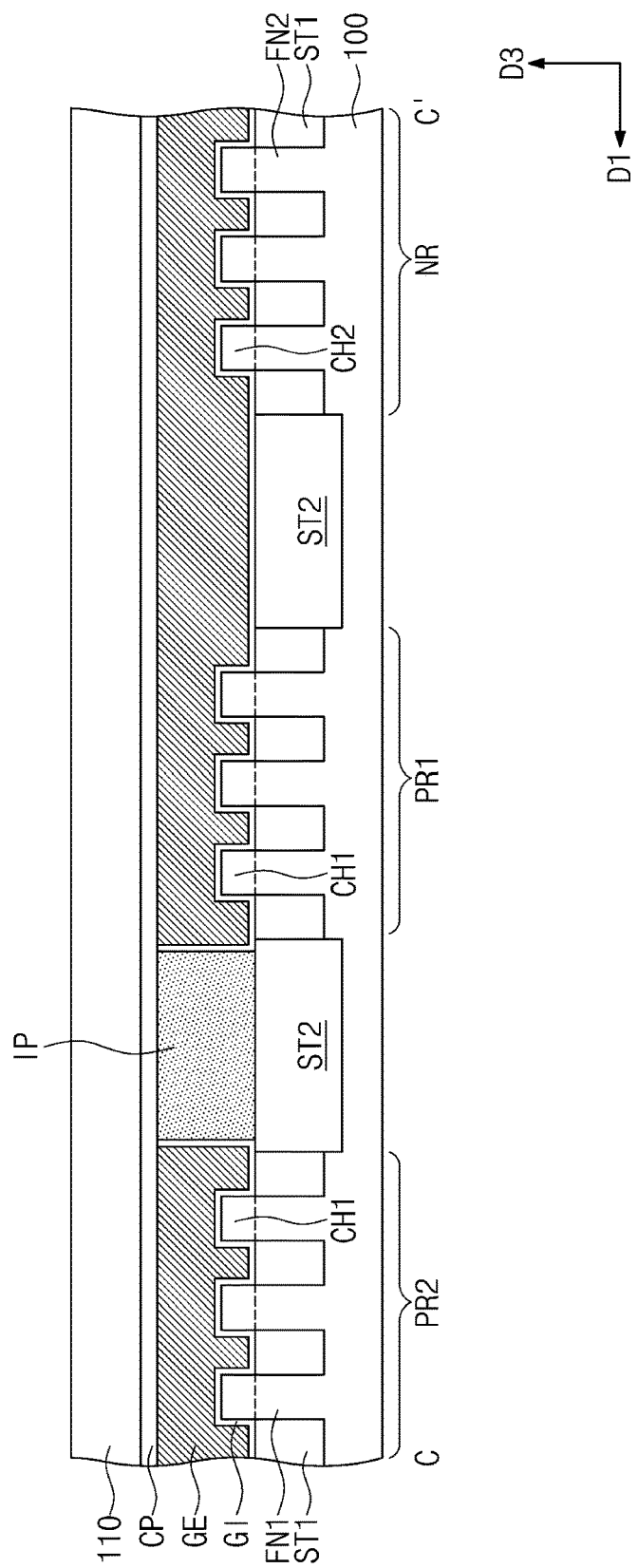
FIGS. 15C, 17C, 19C, and 21C illustrate cross-sectional views taken along line C-C' of FIGS. 14, 16, 18, and 20, respectively.
Figure 15D:
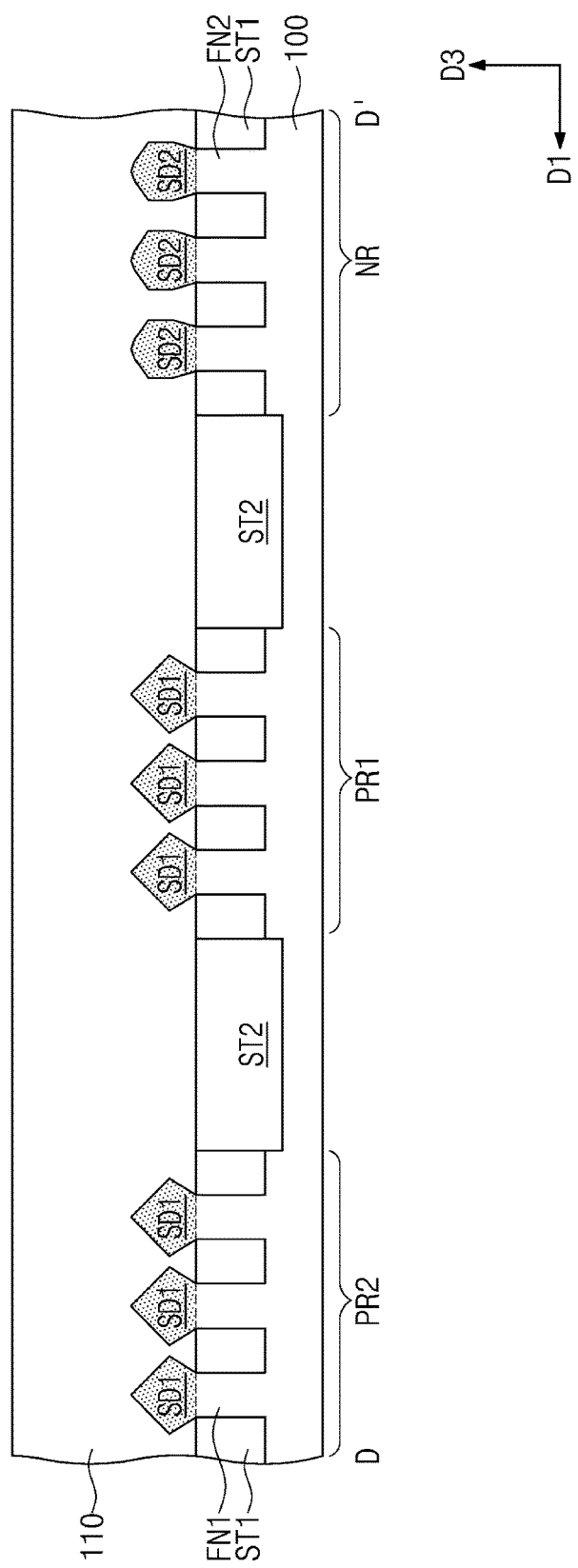
FIGS. 15D, 17D, 19D, and 21D illustrate cross-sectional views taken along line D-D' of FIGS. 14, 16, 18, and 20, respectively.
Figure 16:
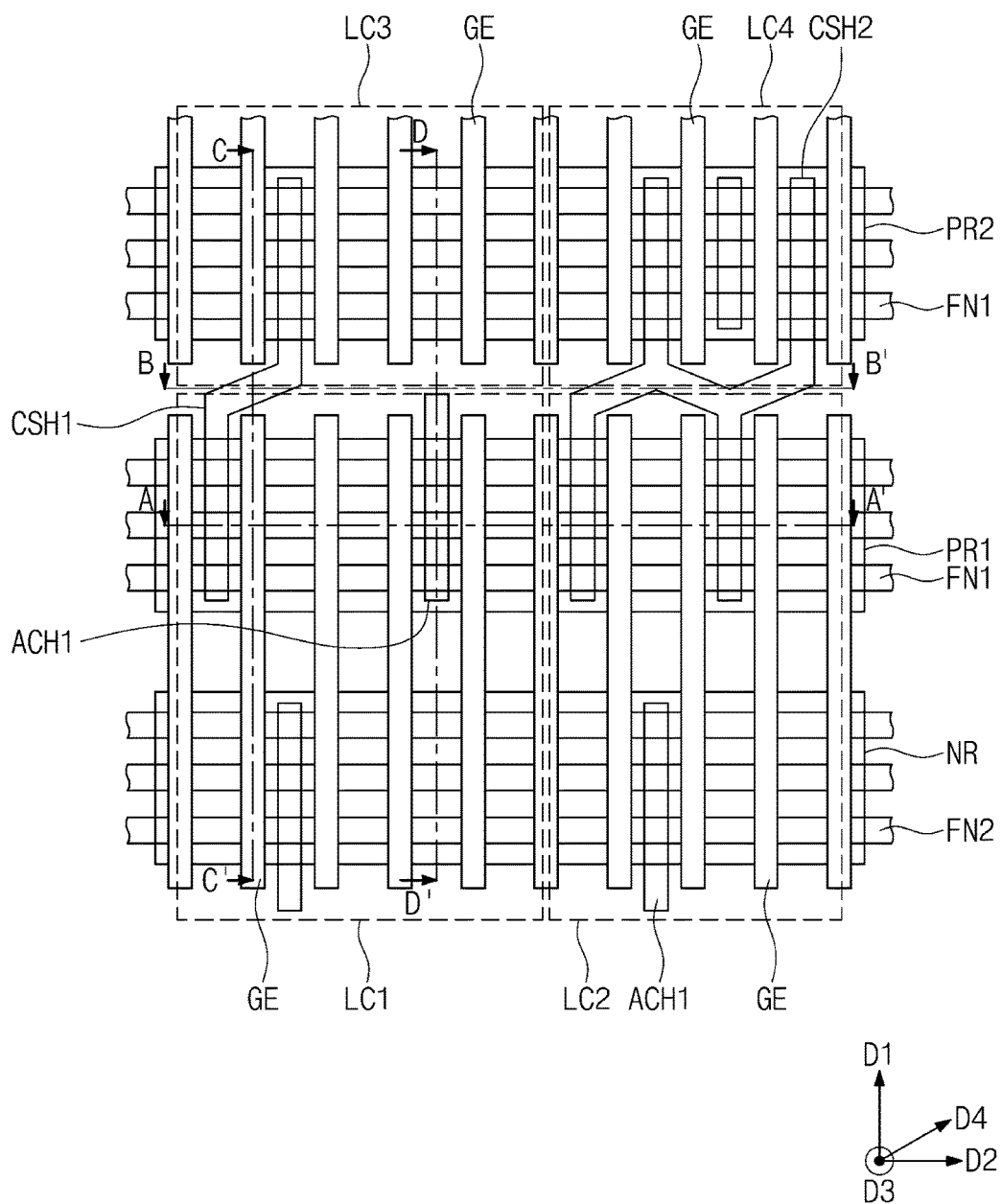
Figure 17A:
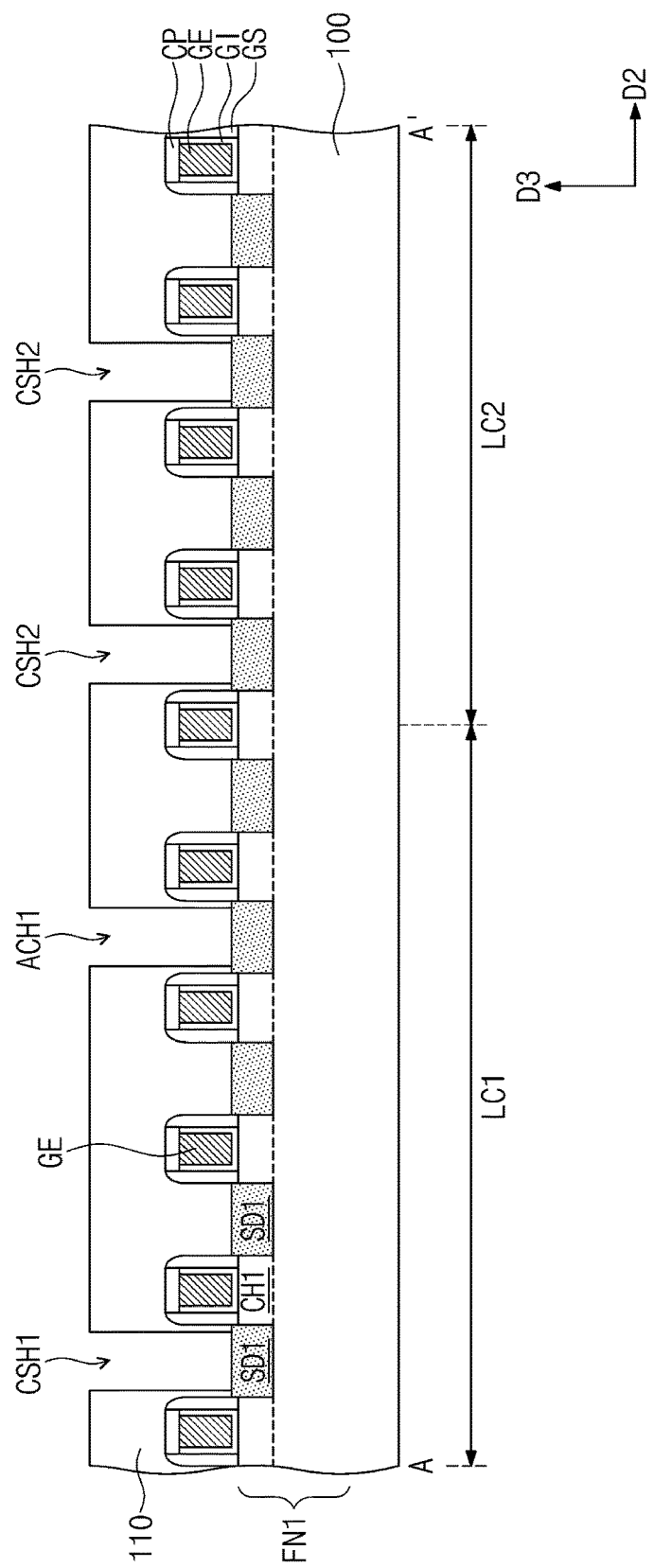
Figure 17B:
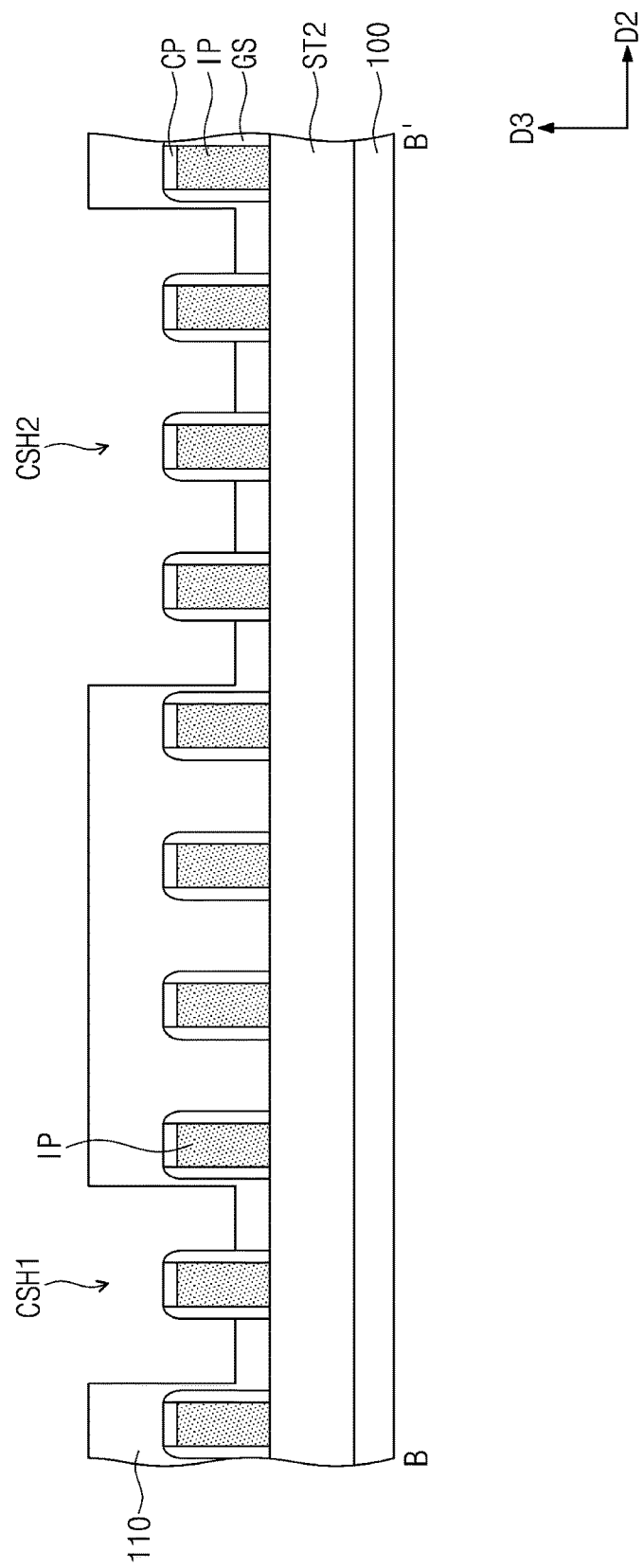
Figure 17C:
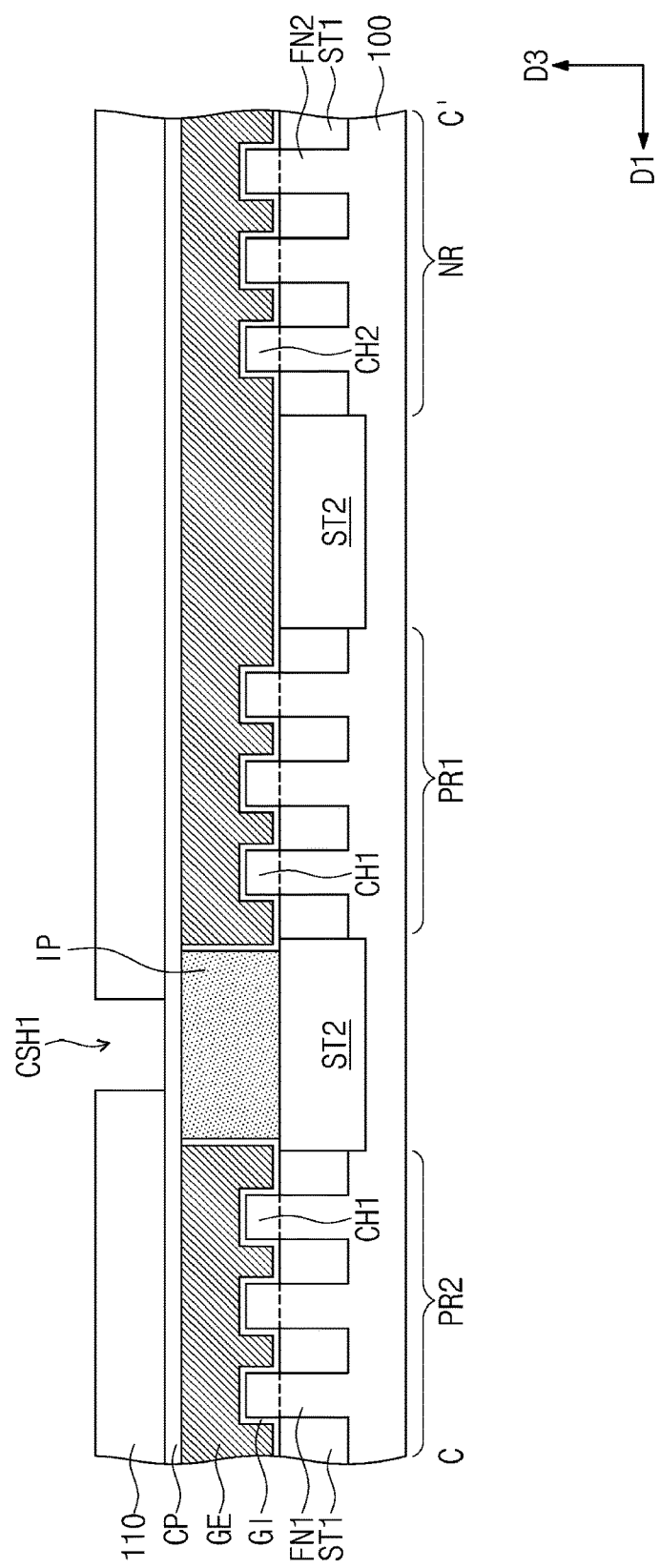
Figure 17D:
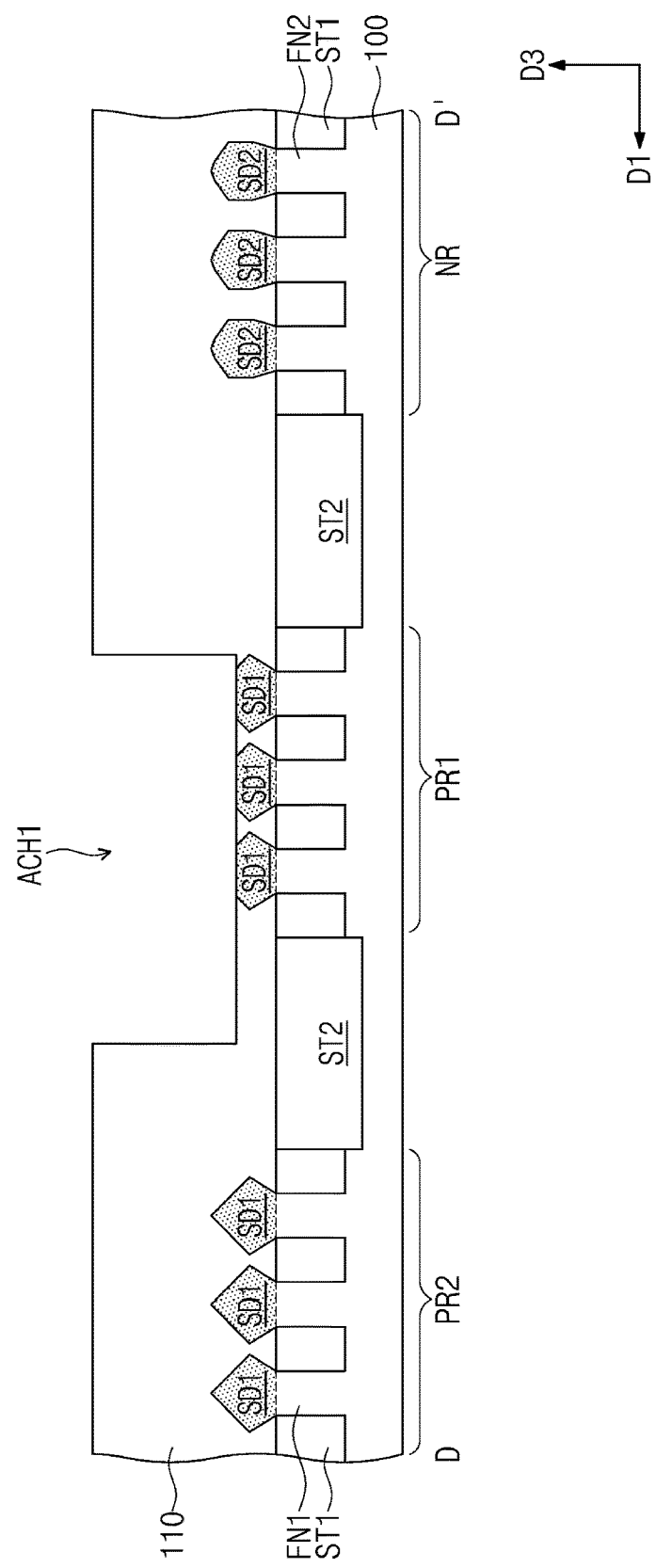
Figure 18:
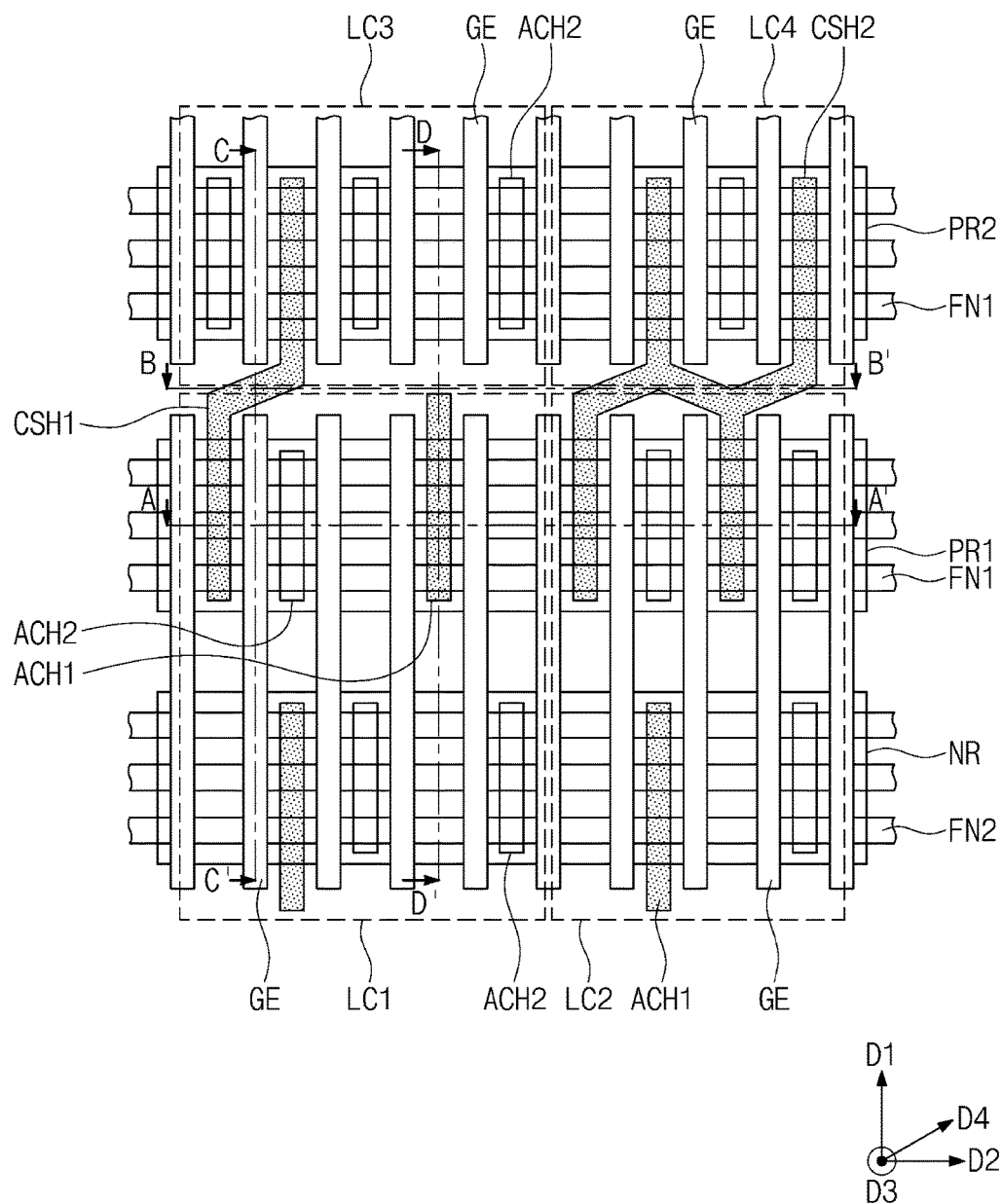
Figure 19A:
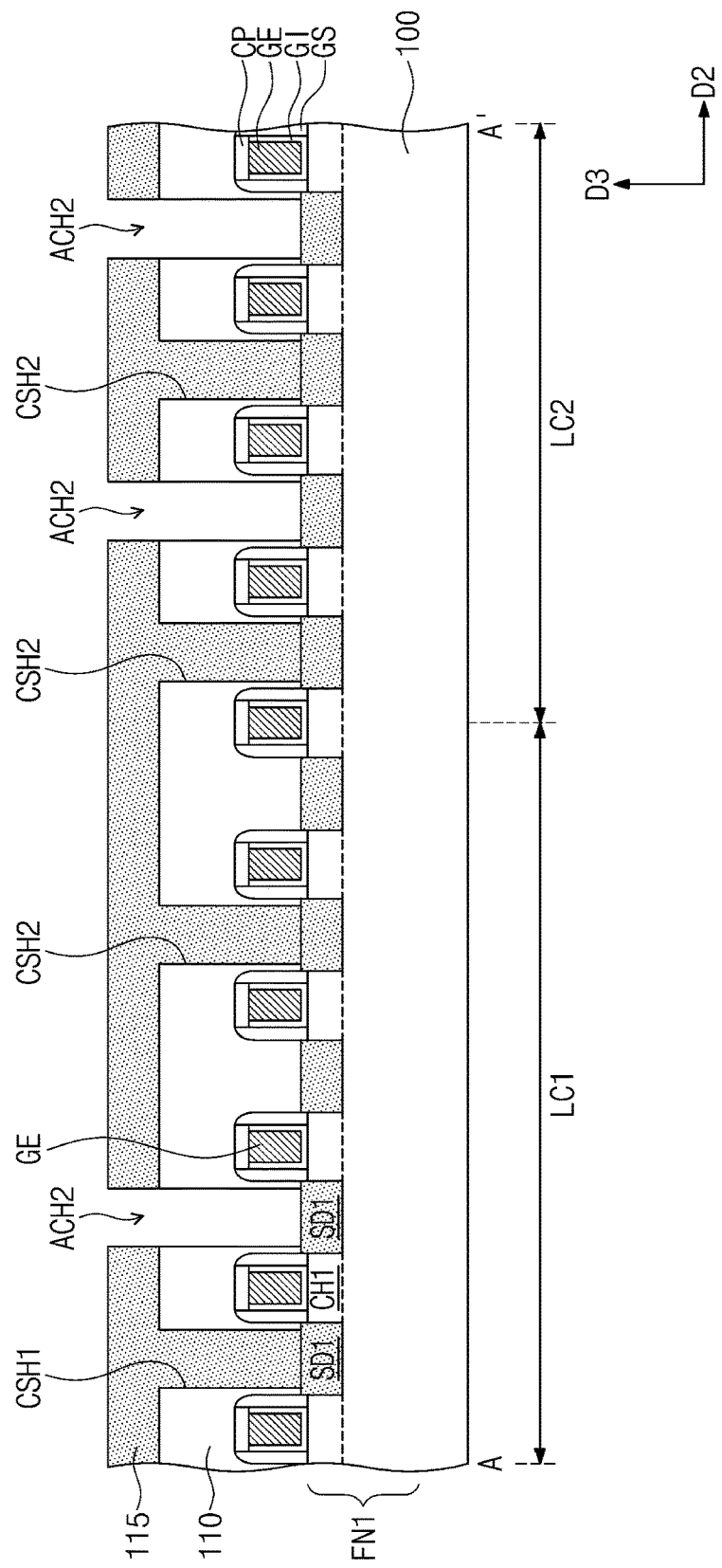
Figure 19B:
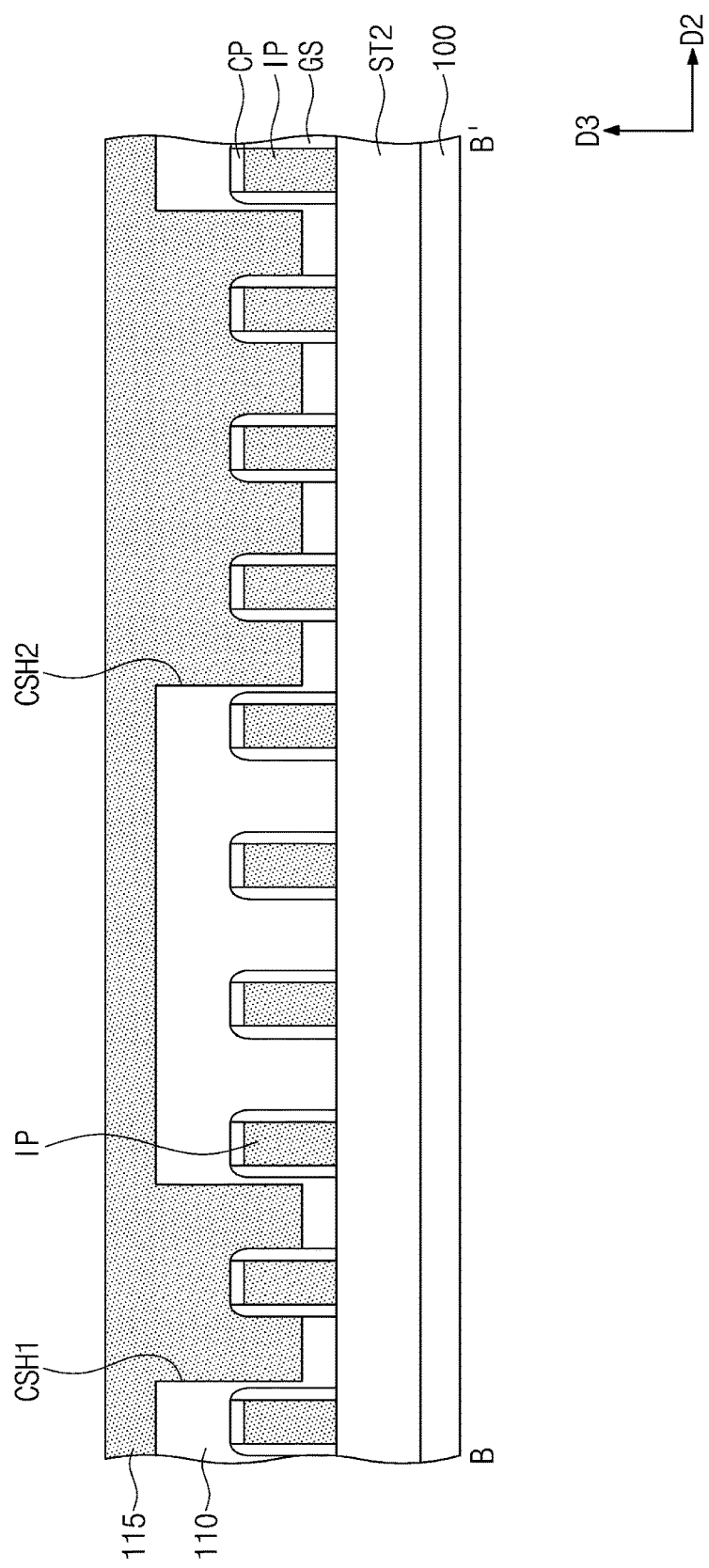
Figure 19C:
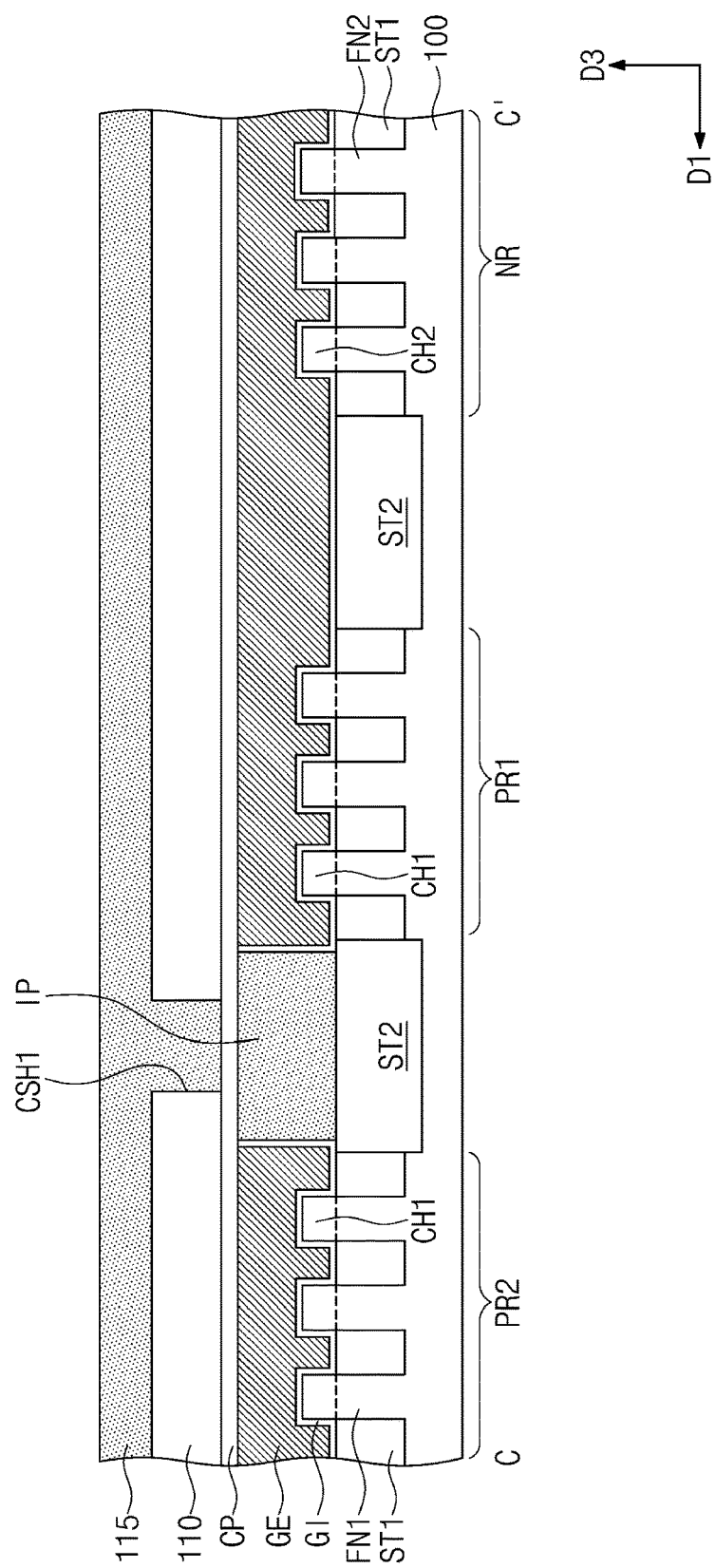
Figure 19D:
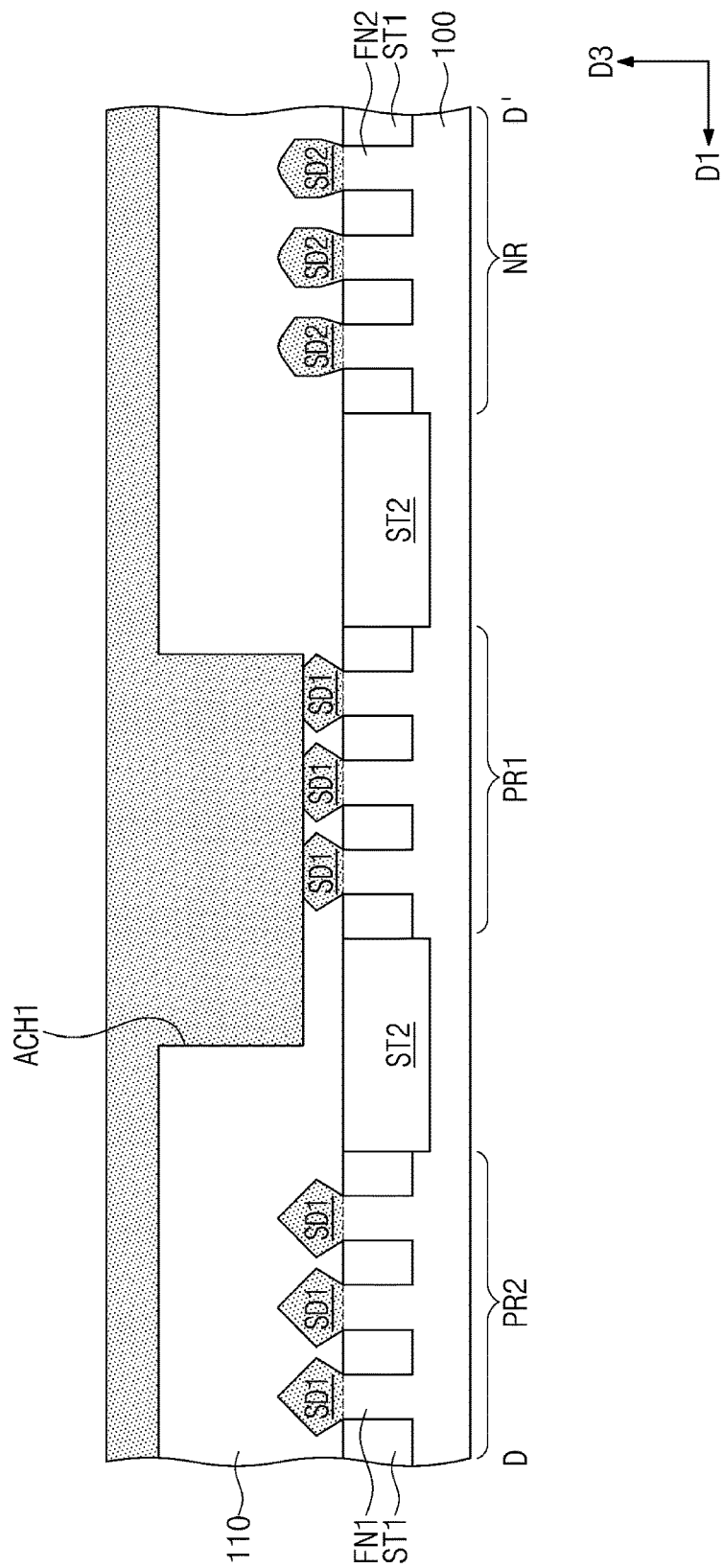
Figure 20:
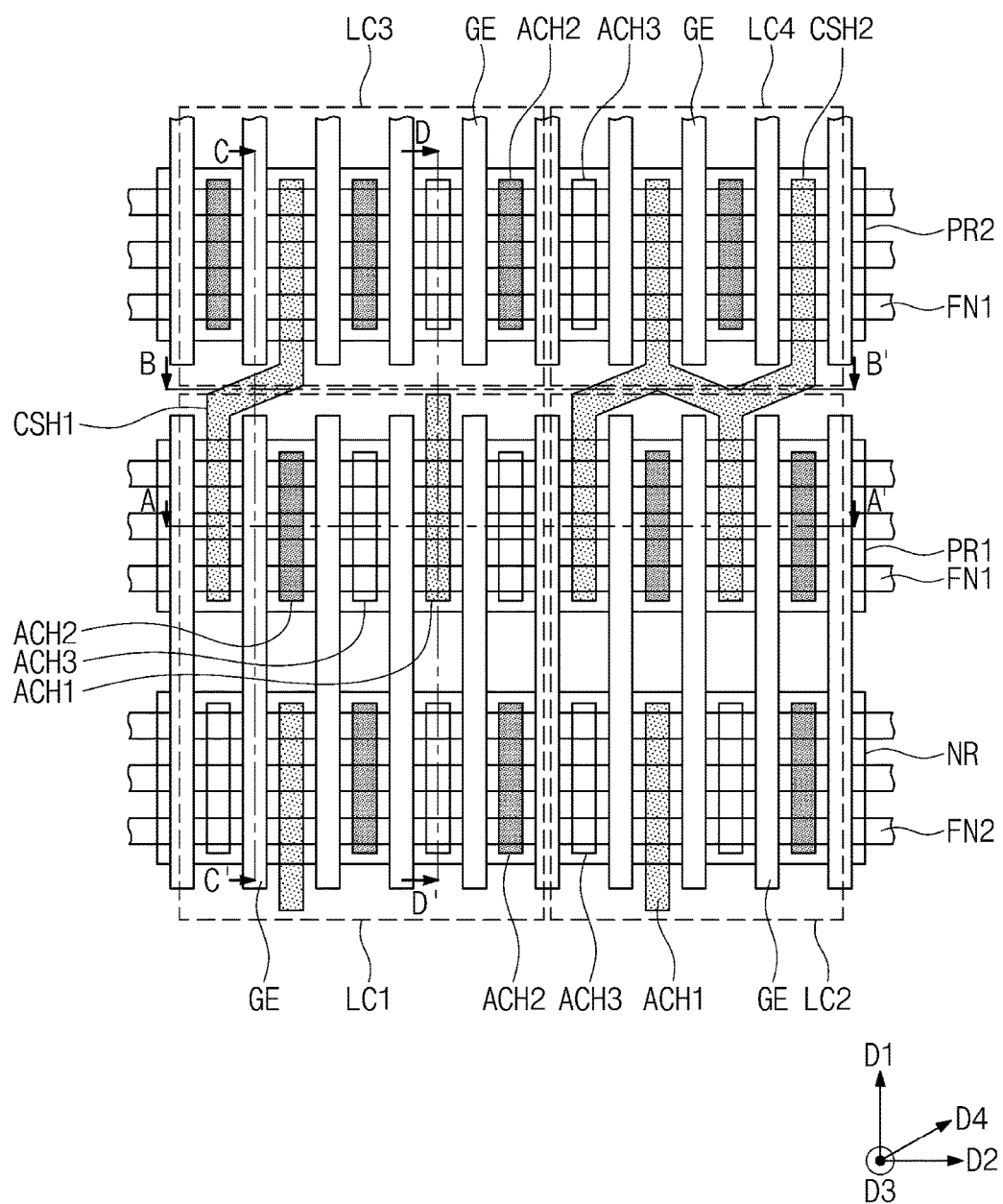
Figure 21A:
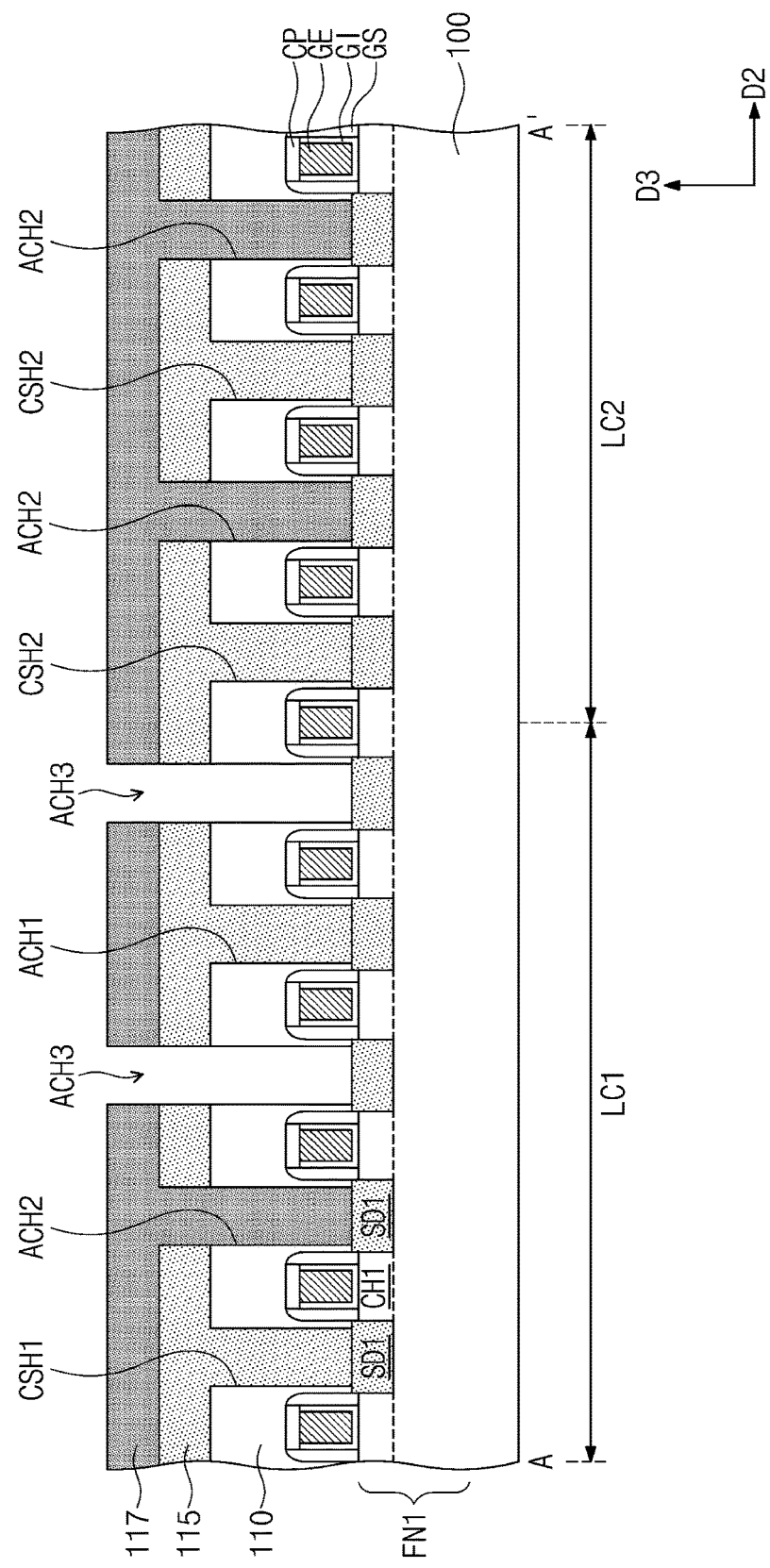
Figure 21B:
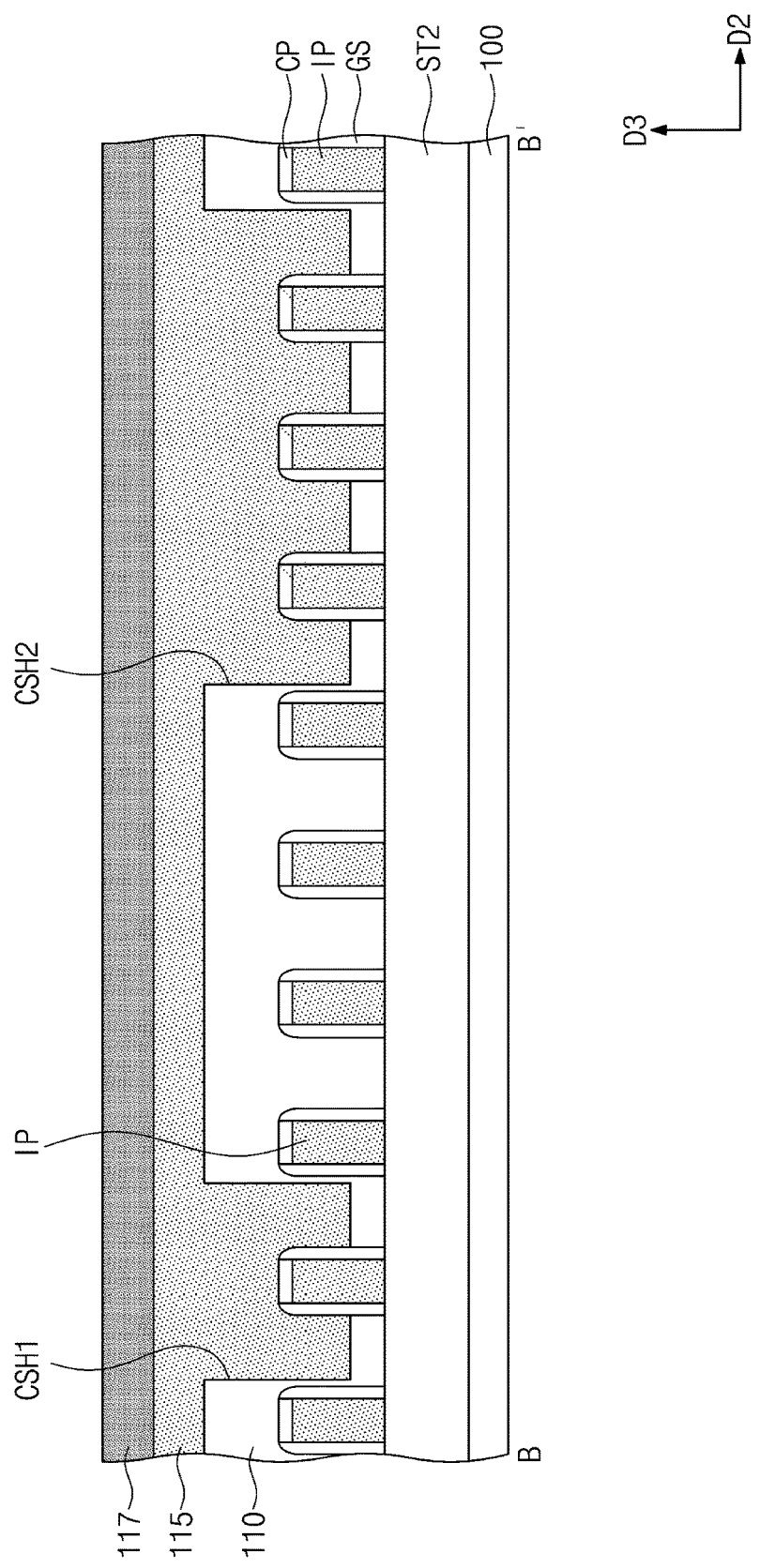
Figure 21C:
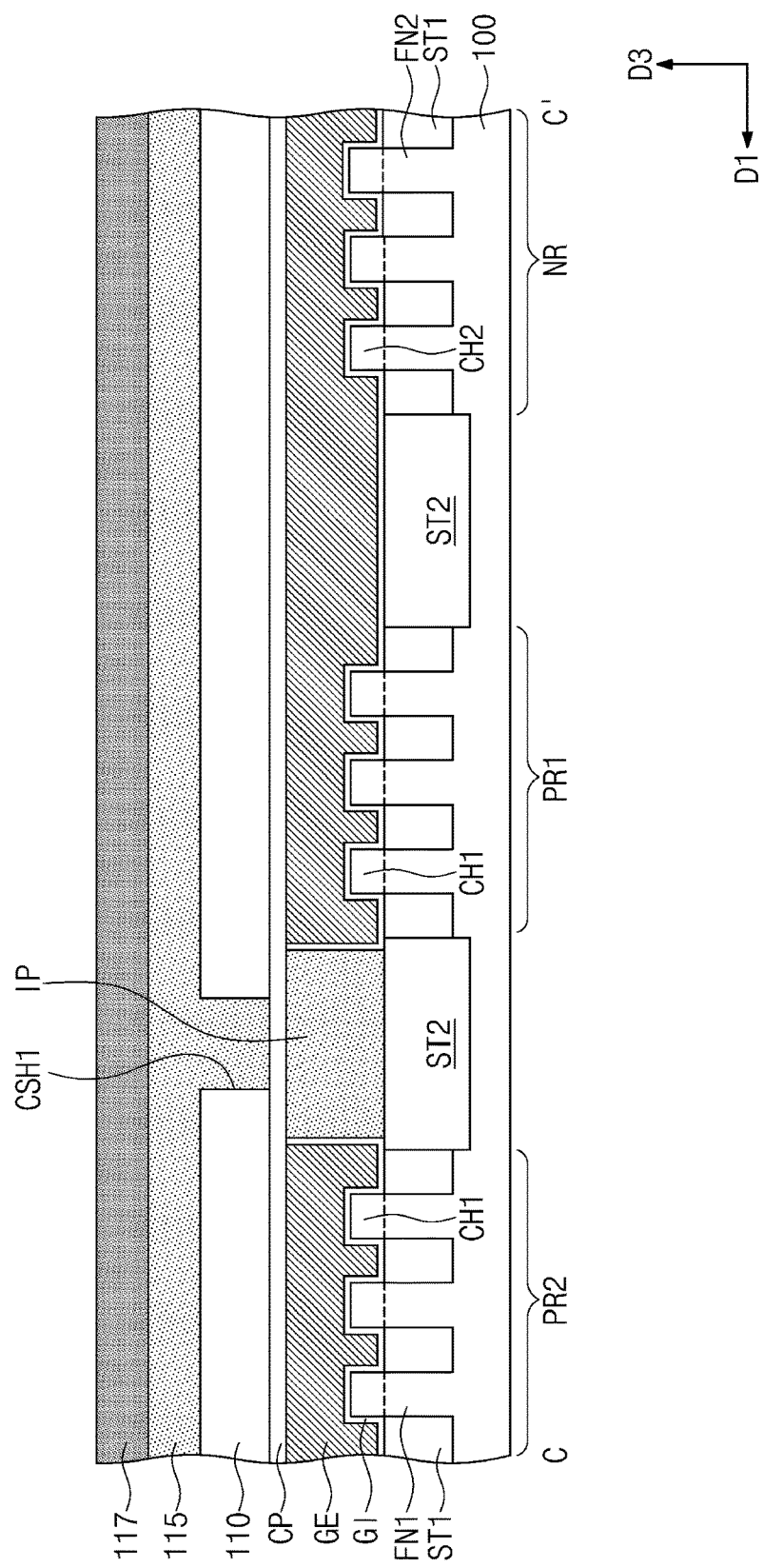
Figure 21D:
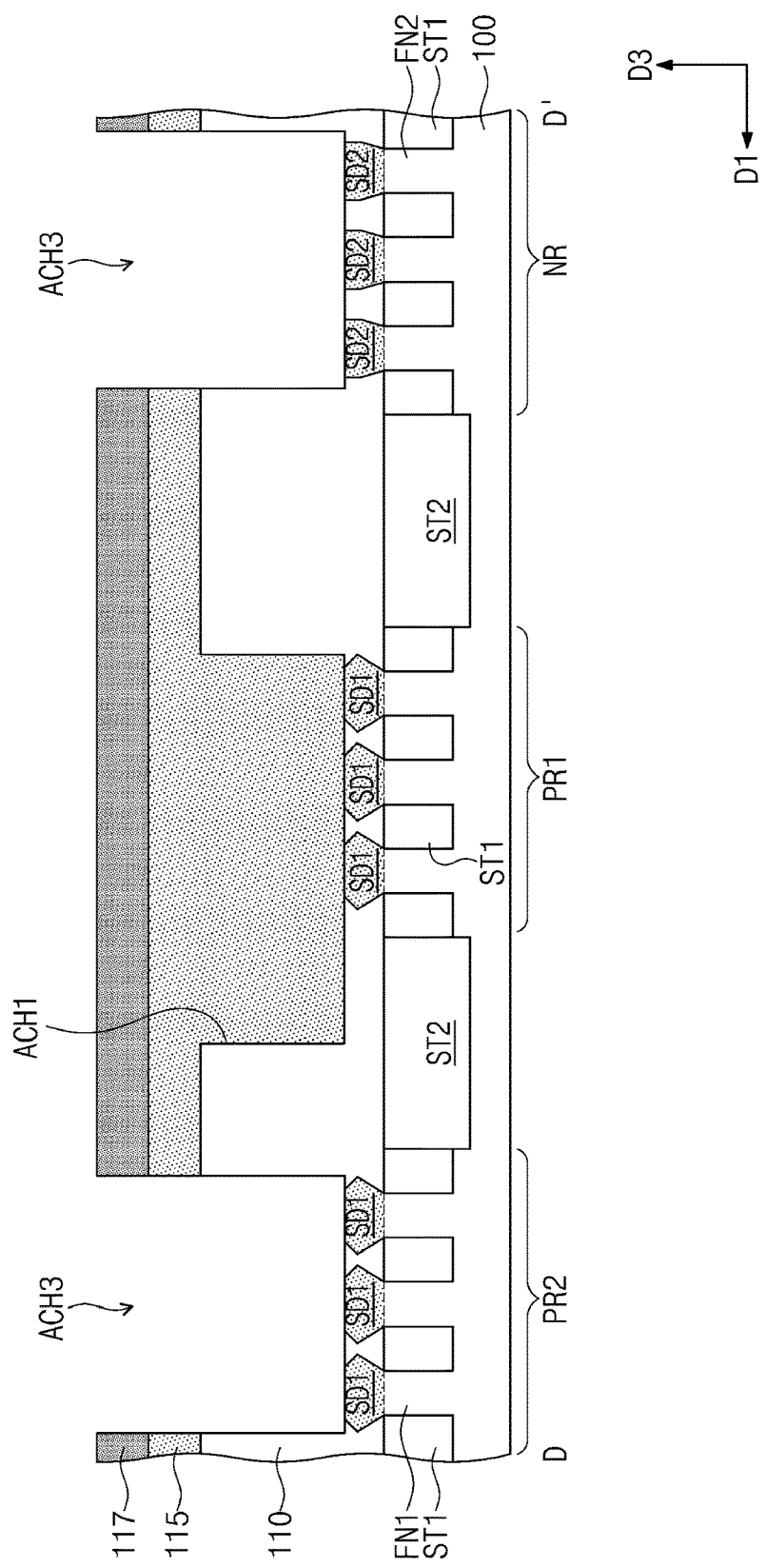

Referring to FIGS. 12, 13A, and 13B, a substrate 100 may be provided. For example, the substrate 100 may be a silicon substrate, a germanium substrate, or a silicon-on-insulator (SOI) substrate. An upper portion of the substrate 100 may be patterned to form first active patterns FN1 and second active patterns FN2. First device isolation layers ST1 may be formed to fill between the first and second active patterns FN1 and FN2. Second device isolation layers ST2 may be formed on the substrate 100 to define a first PMOSFET region PR1, a second PMOSFET region PR2, and an NMOSFET region NR.

A shallow trench isolation (STI) process may be employed to form the first and second device isolation layers ST1 and ST2. Silicon oxide may be used to form the first and second device isolation layers ST1 and ST2.

Referring back to FIGS. 14 and 15A to 15D, gate electrodes GE may be formed to extend in a first direction D1 and to run across the first and second active patterns FN1 and FN2. Gate dielectric layers GI may be formed below the gate electrodes GE. Gate spacers GS may be formed on opposite sides of each of the gate electrodes GE. Gate capping layers CP may be formed on the gate electrodes GE.

For example, the formation of the gate electrodes GE may include forming sacrificial patterns to run across the first and second active patterns FN1 and FN2, forming the gate spacers GS on opposite sides of each of the sacrificial patterns, and replacing the sacrificial patterns with the gate electrodes GE.

Insulation patterns IP may be formed on the second device isolation layer ST2 between the first and second PMOSFET regions PR1 and PR2, and may thus separate the gate electrodes GE from each other. The formation of the insulation patterns IP may include substituting the insulation patterns IP for the sacrificial patterns on the second device isolation layer ST2. The formation of the insulation patterns IP may be followed by the formation of the gate electrodes GE.

The gate electrodes GE may include one or more of metal and conductive metal nitride. The gate dielectric layers GI may include a high-k dielectric material of which dielectric constant is greater than that of a silicon oxide layer. The gate spacers GS may include one or more of SiCN, SiCON, and SiN. The gate capping layers CP may include one or more of SiON, SiCN, SiCON, and SiN. The insulation patterns IP may include silicon nitride or silicon oxynitride.

First source/drain regions SD1 may be formed on or at upper portions of the first active patterns FN1. Second source/drain regions SD2 may be formed on or at upper portions of the second active patterns FN2. The first and second source/drain regions SD1 and SD2 may be formed on opposite sides of each of the gate electrodes GE. The first source/drain regions SD1 may be doped with p-type impurities, and the second source/drain regions SD2 may be doped with n-type impurities.

For example, the first and second source/drain regions SD1 and SD2 may be epitaxial patterns formed by a selective epitaxial growth process. A process may be performed to partially recess the first and second active patterns FN1 and FN2 on opposite sides of each of the gate electrodes GE, and then an epitaxial growth process may be performed on the recessed portions of the first and second active patterns FN1 and FN2.

A first interlayer dielectric layer 110 may be formed on an entire surface of the substrate 100. The first interlayer dielectric layer 110 may cover the first and second active patterns FN1 and FN2, the gate spacers GS, and the gate capping layers CP. The first interlayer dielectric layer 110 may be formed of a silicon oxide layer or a silicon oxynitride layer.

Referring to FIGS. 16 and 17A to 17D, first contact holes ACH1 may be formed to penetrate the first interlayer dielectric layer 110 and to expose the first and second source/drain regions SD1 and SD2. First and second connection holes CSH1 and CSH2 may be formed to penetrate the first interlayer dielectric layer 110 and to expose the first source/drain regions SD1.

The first contact holes ACH1 and the first and second connection holes CSH1 and CSH2 may be formed using the first group that includes the first contact patterns ACP_a and the first and second connection patterns CSP1 and CSP2 discussed with reference to FIG. 11. For example, the formation of the first contact holes ACH1 and the first and second connection holes CSH1 and CSH2 may include fabricating a first photomask by using the first group and then patterning the first interlayer dielectric layer 110 by performing a first photolithography process using the first photomask.

Referring to FIGS. 18 and 19A to 19D, a first mold layer 115 may be formed on the first interlayer dielectric layer 110 to fill the first contact holes ACH1 and the first and second connection holes CSH1 and CSH2. Second contact holes ACH2 may be formed to penetrate the first mold layer 115 and the first interlayer dielectric layer 110 and to expose the first and second source/drain regions SD1 and SD2.

The second contact holes ACH2 may be formed using the second group that includes one or more of the second contact patterns ACP_b of FIG. 11. For example, the formation of the second contact holes ACH2 may include fabricating a second photomask by using the second group and then patterning the first mold layer 115 and the first interlayer dielectric layer 110 by performing a second photolithography process using the second photomask.

Referring to FIGS. 20 and 21A to 21D, a second mold layer 117 may be formed on the first mold layer 115 to fill the second contact holes ACH2. Third contact holes ACH3 may be formed to penetrate the first mold layer 115 and the first interlayer dielectric layer 110 and to expose the first and second source/drain regions SD1 and SD2.

The third contact holes ACH3 may be formed using the third group that includes the rest ones of the second contact patterns ACP_b of FIG. 11. For example, the formation of the third contact holes ACH3 may include fabricating a third photomask by using the third group and then patterning the second mold layer 117, the first mold layer 115, and the first interlayer dielectric layer 110 by performing a third photolithography process using the third photomask.

Referring back to FIGS. 2 and 3A to 3D, the first and second mold layers 115 and 117 may be removed. The first and second connection holes CSH1 and CSH2 may be filled with a metallic material to form first and second connection structures CS1 and CS2 respectively filling the first and second connection holes CSH1 and CSH2. The first contact holes ACH1 may be filled with a metallic material to form first active contacts AC_a. The second and third contact holes ACH2 and ACH3 may be filled with a metallic material to form second active contacts AC_b. The metallic material may include one or more of aluminum, copper, tungsten, molybdenum, and cobalt.

A second interlayer dielectric layer 120 may be formed on the first interlayer dielectric layer 110. The second interlayer dielectric layer 120 may be formed of a silicon oxide layer or a silicon oxynitride layer. First and second power lines PL1 and PL2, electrical lines M1, and vias VI may be formed in the second interlayer dielectric layer 120. The vias VI may be formed between the electrical lines M1 and the second active contacts AC_b, between the first and second power lines PL1 and PL2 and the first and second connection structures CS1 and CS2, and between the first active contacts AC_a and the first and second power lines PL1 and PL2.

In a semiconductor device according to embodiments of the present inventive concept, a single connection structure may electrically connect the power line to the source/drain regions of different logic cells. As such, the semiconductor device may thus be increased in integration and simplified in manufacture.

What is claimed is:

1. A semiconductor device, comprising:
    a substrate;
    a first logic cell disposed on the substrate and including a first active pattern;
    a second logic cell disposed on the substrate and including a second active pattern;
    a first gate electrode extending in a first direction and disposed on the first logic cell;
    a second gate electrode extending in the first direction and disposed on the second logic cell;
    a power line extending lengthwise in a second direction at a boundary that extends in the second direction between the first and second logic cells, the second direction being perpendicular to the first direction;
    a connection structure electrically connecting the power line to the first active pattern and to the second active pattern; and
    a via between the power line and the connection structure,
    wherein the connection structure is disposed below the power line and extends from the first logic cell to the second logic cell,
    wherein the connection structure is electrically isolated from the first and second gate electrodes, and
    wherein a top surface of the connection structure is at a higher level than that of a top surface of the first gate electrode.

2. The semiconductor device of claim 1, wherein the second gate electrode is aligned in the first direction with the first gate electrode, and
    wherein the connection structure runs between the first gate electrode and the second gate electrode, in plan view.

3. The semiconductor device of claim 1, further comprising an insulation pattern between and separating the first gate electrode and the second gate electrode,
    wherein the connection structure crosses over the insulation pattern.

4. The semiconductor device of claim 1, wherein the connection structure comprises:
    a first contact portion disposed on the first active pattern;
    a second contact portion disposed on the second active pattern; and
    a bridge portion connecting the first contact portion to the second contact portion, and extending either in the second direction or in a third direction, the third direction being perpendicular to the first and second directions.

5. The semiconductor device of claim 4, wherein the second contact portion is offset from a virtual line in the second direction, and
the virtual line runs across a center of the first contact portion and extends in the first direction.

6. The semiconductor device of claim 1, wherein the connection structure comprises:
a plurality of first contact portions disposed on the first active pattern;
a plurality of second contact portions disposed on the second active pattern; and
a bridge portion connecting the plurality of first contact portions to the plurality of second contact portions, and extending in a zigzag path at the boundary between the first and second logic cells, in plan view.

7. The semiconductor device of claim 1, wherein the first active pattern and the first gate electrode constitute a first transistor, and
the second active pattern and the second gate electrode constitute a second transistor, the first and second transistors having the same conductivity.

8. The semiconductor device of claim 1,
wherein the via has a bar shape extending in a third direction that are perpendicular to the first and second direction, in plan view, and
the connection structure has a portion below the via, the portion of the connection structure extending in the third direction.

9. The semiconductor device of claim 1, wherein the first active pattern comprises:
a first channel region disposed below the first gate electrode; and
a plurality of first source/drain regions disposed at opposite sides of the first channel region,
wherein the second active pattern comprises:
a second channel region disposed below the second gate electrode; and
a plurality of second source/drain regions disposed at opposite sides of the second channel region, and
wherein the connection structure connects the plurality of first source/drain regions to the plurality of second source/drain region.

10. A semiconductor device, comprising:
a substrate;
a first logic cell disposed on the substrate and including a first active pattern;
a second logic cell disposed on the substrate and including a second active pattern;
a first gate electrode extending in a first direction and disposed on the first logic cell;
a second gate electrode extending in the first direction and disposed on the second logic cell;
a power line extending in a second direction at a boundary between the first and second logic cells, the second direction being perpendicular to the first direction; and
a connection structure electrically connecting the power line to the first active pattern and to the second active pattern,
wherein the connection structure comprises:
a first contact portion disposed on the first active pattern;
a second contact portion disposed on the second active pattern; and
a bridge portion connecting the first contact portion to the second contact portion, wherein the second gate electrode is aligned in the first direction with the first gate electrode, and
wherein the bridge portion is disposed between the first gate electrode and the second gate electrode, in plan view.

11. The semiconductor device of claim 10, further comprising an insulation pattern between and separating the first gate electrode and the second gate electrode,
wherein the bridge portion crosses over the insulation pattern.

12. The semiconductor device of claim 10, further comprising a device isolation layer disposed between the first and second logic cells,
wherein the bridge portion is disposed on the device isolation layer.

13. The semiconductor device of claim 10, wherein the second contact portion is offset from a virtual line in the second direction,
the virtual line passes through a center of the first contact portion and extends in the first direction, and
the bridge portion extends either in the second direction or in a third direction that is perpendicular to the first and second directions.

14. The semiconductor device of claim 10, further comprising:
an active contact connected to the first active pattern and the second active pattern; and
an electrical line provided on and electrically connected to the active contact,
wherein a top surface of the connection structure and a top surface of the active contact are positioned at the same level, and
wherein a top surface of the power line and a top surface of the electrical line are positioned at the same level.

15. The semiconductor device of claim 10, wherein the first active pattern comprises:
a first channel region disposed below the first gate electrode; and
a plurality of first source/drain regions disposed at opposite sides of the first channel region,
wherein the second active pattern comprises:
a second channel region disposed below the second gate electrode; and
a plurality of second source/drain regions disposed at opposite sides of the second channel region, and
wherein the plurality of first source/drain regions are electrically connected to the first contact portion and have a first conductivity, and
the plurality of second source/drain regions are electrically connected to the second contact portion and have the first conductivity.

16. A semiconductor device, comprising:
a substrate;
a first logic cell disposed on the substrate and including a first active pattern;
a second logic cell disposed on the substrate and including a second active pattern;
a first gate electrode extending in a first direction and disposed on the first logic cell;
a second gate electrode extending in the first direction and disposed on the second logic cell;
a power line extending lengthwise in a second direction at a boundary between the first and second logic cells, the second direction being perpendicular to the first direction; and a connection structure electrically connecting the power line to the first active pattern and to the second active pattern, wherein the second gate electrode is aligned in the first direction with the first gate electrode, and wherein the connection structure extends in at least two directions and comprises a bridge portion that runs between the first gate electrode and the second gate electrode, in plan view.

17. The semiconductor device of claim 16, further comprising an insulation pattern between and separating the first gate electrode and the second gate electrode, wherein the connection structure crosses over the insulation pattern.

18. The semiconductor device of claim 16, wherein the connection structure further comprises:

a first contact portion disposed on the first active pattern; and a second contact portion disposed on the second active pattern, wherein the bridge portion connects the first contact portion to the second contact portion, and extends either in the second direction or in a third direction, the third direction being perpendicular to the first and second directions.

19. The semiconductor device of claim 18, wherein the second contact portion is offset from a virtual line in the second direction, and the virtual line runs across a center of the first contact portion and extends in the first direction.

20. The semiconductor device of claim 16, wherein the connection structure further comprises:

a plurality of first contact portions disposed on the first active pattern; and a plurality of second contact portions disposed on the second active pattern, wherein the bridge portion connects the plurality of first contact portions to the plurality of second contact portions, and extends in a zigzag path at the boundary between the first and second logic cells, in plan view.

* * * * *